United States Patent
Szajewski et al.

(10) Patent No.: US 7,423,679 B2
(45) Date of Patent: Sep. 9, 2008

(54) IMAGING SYSTEM HAVING EXTENDED USEFUL LATITUDE

(75) Inventors: Richard P. Szajewski, Rochester, NY (US); Lyn M. Irving, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 940 days.

(21) Appl. No.: 10/326,455

(22) Filed: Dec. 20, 2002

(65) Prior Publication Data

US 2004/0119104 A1 Jun. 24, 2004

(51) Int. Cl.
*H04N 5/225* (2006.01)
*H04N 3/14* (2006.01)

(52) U.S. Cl. .............. 348/308; 348/340; 348/218.1

(58) Field of Classification Search ........... 348/335, 348/340, 362, 294, 302, 308, 218.1, 239; 250/208.1
See application file for complete search history.

(56) References Cited

U.S. PATENT DOCUMENTS

| 992,151 A | 5/1911 | Berthon |
|---|---|---|
| 1,746,584 A | 2/1930 | Fournier |
| 1,749,278 A | 3/1930 | Frederick |
| 1,824,353 A | 9/1931 | Jensen |
| 1,838,173 A | 12/1931 | Chretien |
| 1,849,036 A | 3/1932 | Ernst |
| 1,942,841 A | 1/1934 | Shimizu |
| 1,985,731 A | 12/1934 | Ives |
| 2,143,762 A | 1/1939 | Carstaff |
| 2,144,649 A | 1/1939 | Eggert et al. |
| 2,191,038 A | 2/1940 | Capstaff |
| 2,252,006 A | 8/1941 | Holst et al. |
| 2,304,988 A | 12/1942 | Yule |
| 2,316,644 A | 4/1943 | Yule |
| 2,407,211 A | 9/1946 | Yule |
| 2,455,849 A | 12/1948 | Yule |
| 2,691,586 A | 10/1954 | Yule et al. |
| 2,992,103 A | 7/1961 | Land et al. |
| 3,413,117 A | 11/1968 | Gaynor |
| 3,506,350 A | 4/1970 | Denner |
| 3,905,701 A | 9/1975 | David |
| 3,954,334 A | 5/1976 | Bestenreiner et al. |

(Continued)

FOREIGN PATENT DOCUMENTS

EP 1 067 780 A 1/2001

(Continued)

OTHER PUBLICATIONS

Edward M. Crane and C. H. Evans, "Devices for Making Sensitometric Exposures on Embossed Kinescope Recording Film" Jan. 1958, pp. 13-16, Journals of the SMPTE vol. 67.

(Continued)

*Primary Examiner*—Lin Ye
*Assistant Examiner*—Timothy J Henn
(74) *Attorney, Agent, or Firm*—Ronald R. Schindler

(57) ABSTRACT

The invention provides an image sensor that has an array of photosensors and an array of micro-lenses with each micro-lens confronting more than one of the photosensors and concentrating light striking each micro-lens onto less than all of the confronted photosensors so that selected photosensors receive a greater exposure than other photosensors.

12 Claims, 12 Drawing Sheets

U.S. PATENT DOCUMENTS

| | | |
|---|---|---|
| 3,971,065 A | 7/1976 | Bayer |
| 3,973,953 A | 8/1976 | Montgomery |
| 3,973,954 A | 8/1976 | Bean |
| 3,973,957 A | 8/1976 | Montgomery |
| 3,973,958 A | 8/1976 | Bean |
| 4,040,830 A | 8/1977 | Rogers |
| 4,272,186 A | 6/1981 | Plummer |
| 4,458,002 A | 7/1984 | Janssens et al. |
| 4,483,916 A | 11/1984 | Thiers |
| 4,642,678 A | 2/1987 | Cok |
| 4,667,092 A | 5/1987 | Ishihara |
| 5,016,107 A | 5/1991 | Sasson et al. |
| 5,164,831 A | 11/1992 | Kuchta et al. |
| 5,373,322 A | 12/1994 | Larouche et al. |
| 5,440,369 A | 8/1995 | Tabata et al. |
| 5,464,128 A | 11/1995 | Keller |
| 5,471,515 A | 11/1995 | Fossum et al. |
| 5,497,269 A | 3/1996 | Gal |
| 5,606,392 A * | 2/1997 | Tintera et al. ............... 396/161 |
| 5,649,250 A | 7/1997 | Sasaki |
| 5,668,597 A | 9/1997 | Parulski et al. |
| 5,676,371 A | 10/1997 | Kelly et al. |
| 5,715,483 A | 2/1998 | Omata et al. |
| 5,731,899 A | 3/1998 | Meyers |
| 5,744,291 A | 4/1998 | Ip |
| 5,751,492 A | 5/1998 | Meyers |
| 5,796,522 A | 8/1998 | Meyers |
| 5,812,322 A | 9/1998 | Meyers |
| 5,822,125 A | 10/1998 | Meyers |
| 5,874,994 A | 2/1999 | Xie et al. |
| 5,877,809 A | 3/1999 | Omata et al. |
| 5,965,875 A | 10/1999 | Merrill |
| 6,067,114 A | 5/2000 | Omata et al. |
| 6,137,535 A * | 10/2000 | Meyers ....................... 348/340 |
| 6,141,048 A | 10/2000 | Meyers |
| 6,381,072 B1 | 4/2002 | Burger |
| 6,660,988 B2 * | 12/2003 | Lee et al. ................. 250/208.1 |
| 6,801,719 B1 * | 10/2004 | Szajewski et al. ........... 396/333 |
| 7,019,274 B2 * | 3/2006 | Yamada ................... 250/208.1 |
| 7,019,279 B2 * | 3/2006 | Oda et al. ................... 250/216 |
| 2003/0141564 A1 * | 7/2003 | Kondo et al. ............... 257/442 |

FOREIGN PATENT DOCUMENTS

| | | |
|---|---|---|
| JP | 05-145857 | 6/1993 |
| JP | 08125933 A * | 5/1996 |
| JP | 09205589 A * | 8/1997 |
| JP | 2001-147466 | 5/2001 |
| JP | 2002-191060 | 7/2002 |

OTHER PUBLICATIONS

J.S. Courtney-Pratt, "Lenticular Plate Multiple Picture Shadowgraph Recording", Sep. 1961, pp. 710-715, Journal of the SMPTE, vol. 70.

C.H.Evans and R.B. Smith, "Color Kinescope Recording on Embossed Film" Jul. 1956, pp. 365-372, Journal of the SMPTE, vol. 65.

Rudolf Kingslake, "The Optics of the Lenticular Color-Film Process", Jan. 1958, pp. 8-13, Journal of the SMPTE, vol. 67.

Furukawa, et al., "A 1/3-inch 380K Pixel (Effective) IT-CCD Image Sensor", Jun. 5, 1992, pp. 595-600, IEEE, vol. 38, No. 3.

Deguchi et al., "Microlens Design Using Simulation Program For CCD Image Sensor", Jun. 5, 1992, pp. 583-589, IEEE, vol. 38, No. 3, Aug. 1992.

* cited by examiner

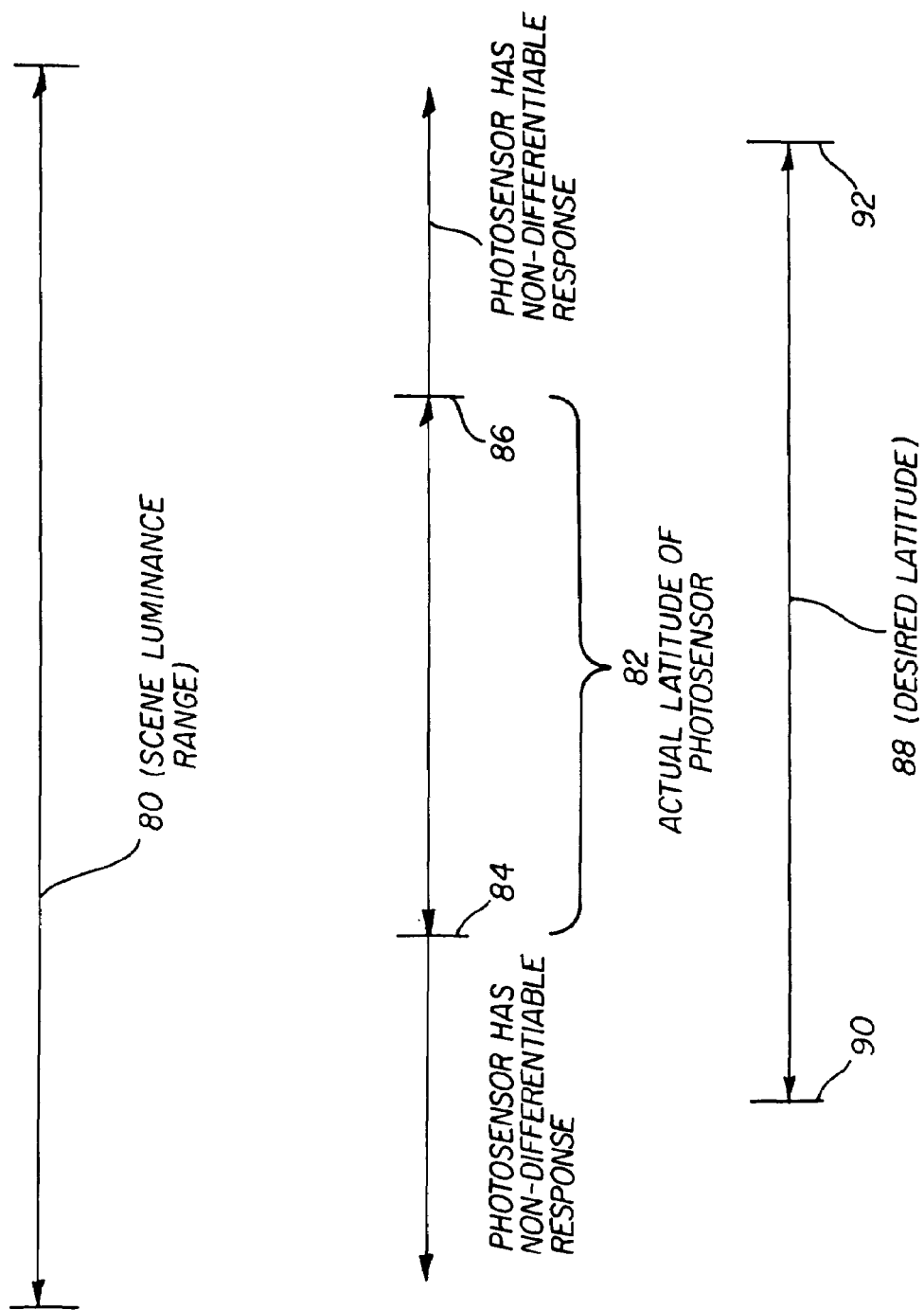

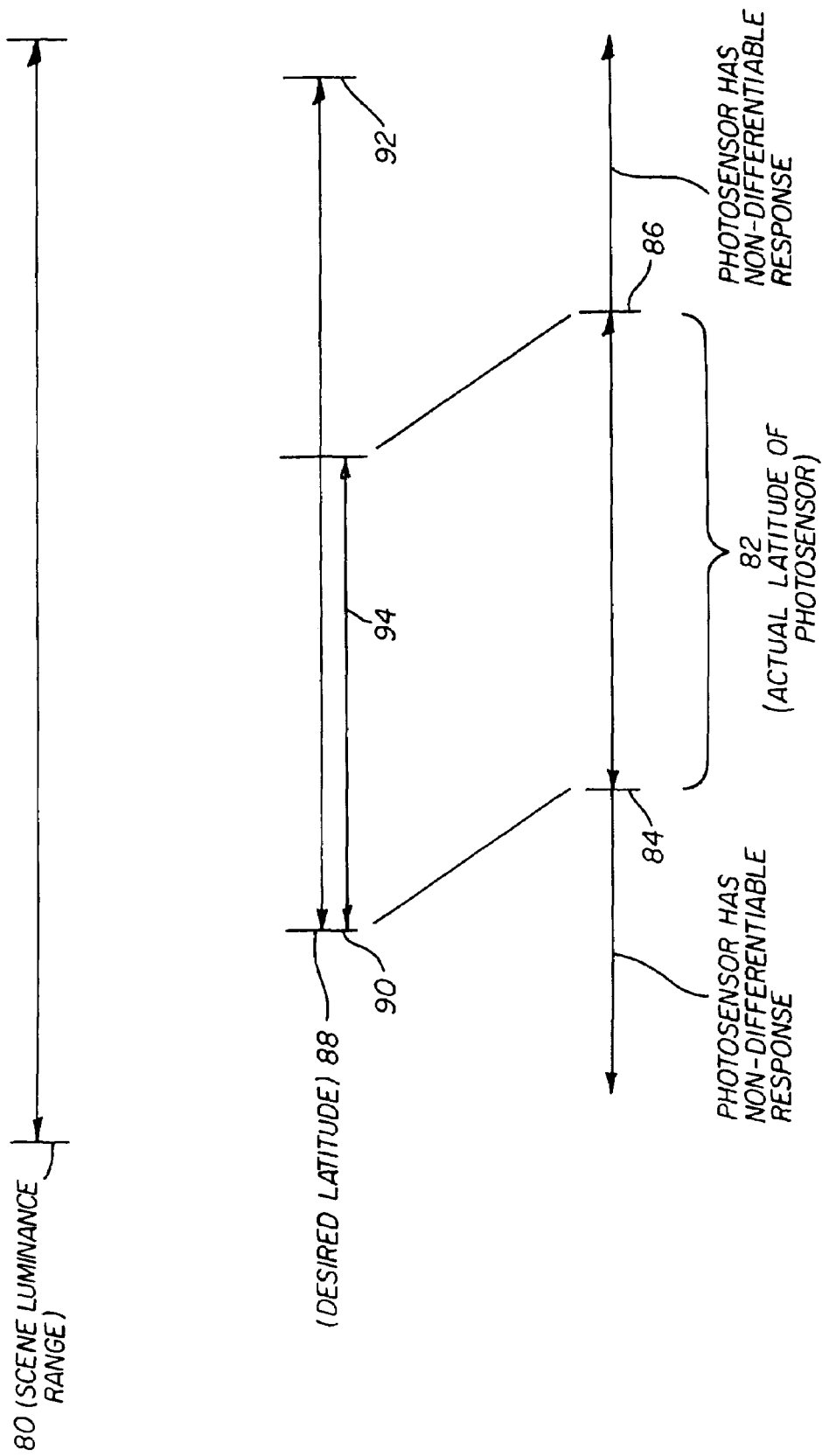

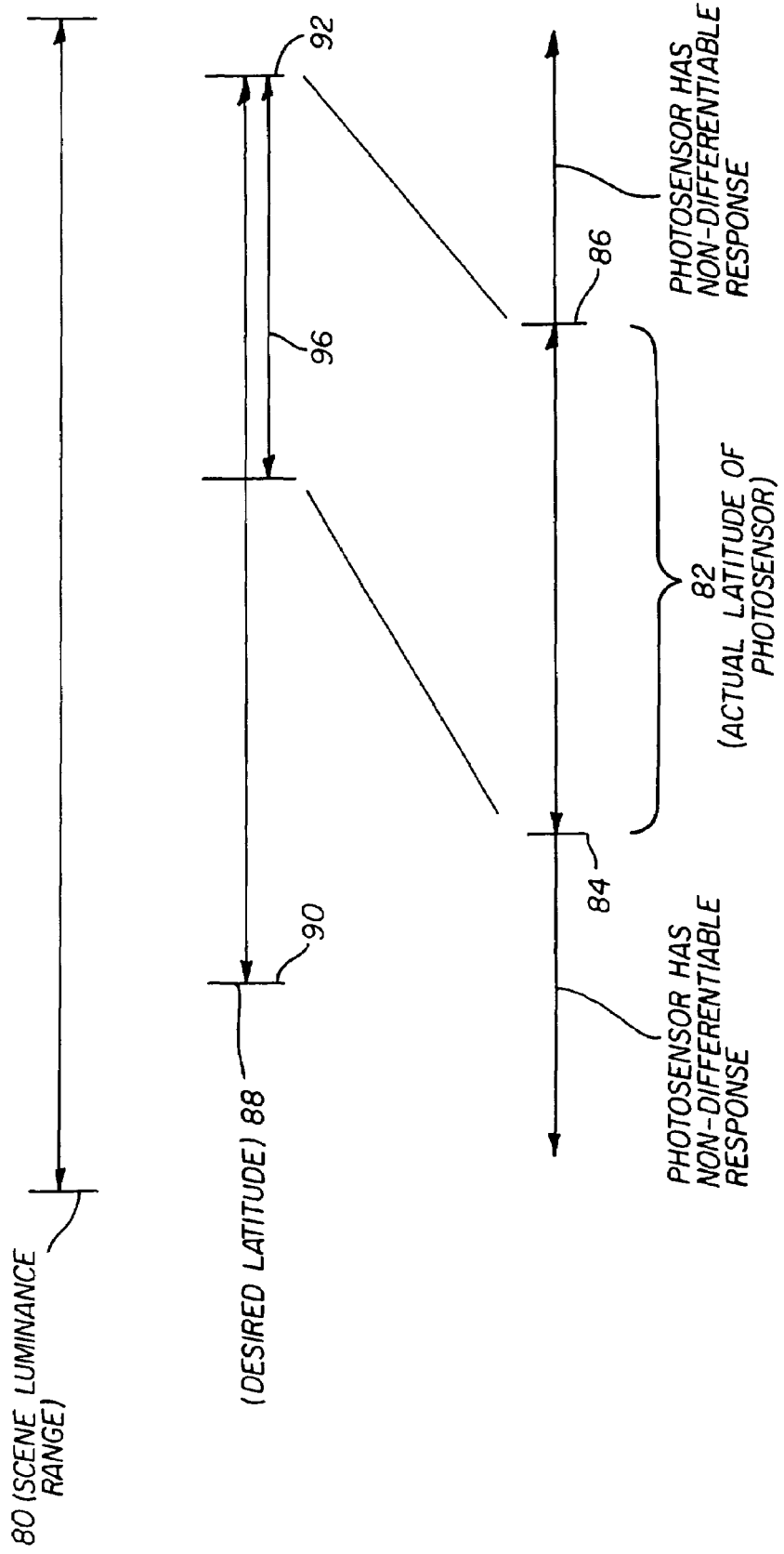

IMAGING SYSTEM HAVING EXTENDED USEFUL LATITUDE

CROSS REFERENCE TO RELATED APPLICATIONS

Cross-reference is made to commonly assigned U.S. patent application Ser. No. 10/170,607 filed Jun. 12, 2002, entitled CAMERA SPEED COLOR FILM WITH BASE SIDE MICRO-LENSES; in the names of Lyn Irving and Richard Szajewski; U.S. patent application Ser. No. 10/171,012, filed Jun. 12, 2002 entitled LENTICULAR IMAGING WITH INCORPORATED BEADS, in the names of Krishnan Chari, Lyn Irving and Richard Szajewski; U.S. patent application Ser. No. 10/167,746, filed Jun. 12, 2002 entitled CAMERA SPEED COLOR FILM WITH EMULSION SIDE MICRO-LENSES, in the names of Richard Szajewski and Lyn Irving; and U.S. patent application Ser. No. 10/167,794, filed Jun. 12, 2002 entitled IMAGING USING SILVER HALIDE FILMS WITH MICRO-LENS CAPTURE, AND OPTICAL RECONSTRUCTION in the names of Richard Szajewski and Lyn Irving, and U.S. patent application Ser. No. 10/170,148, filed Jun. 12, 2002, entitled IMAGING USING SILVER HALIDE FILMS WITH MICRO-LENS CAPTURE, SCANNING AND DIGITAL RECONSTRUCTION filed by Lyn Irving and Richard Szajewski, the contents of which are incorporated herein by reference.

FIELD OF THE INVENTION

This invention relates to solid-state imaging systems and in particular to solid state imaging systems with latitude enhancement systems.

BACKGROUND OF THE INVENTION

Various forms of solid state sensor arrays such as Charge Couple Devices (CCDs), and Complimentary Metal Oxide Semiconductor (CMOS) sensors are currently in use in electronic image capture systems. These solid-state sensors have an imaging surface with an array of photosensors. Light from a scene is focused onto the array of photosensors. Each photosensor generates a signal representative of the number of photons striking the photosensor within an exposure period known as an integration time. The signals from the photosensors are extracted by an image processor and contrast differences between signals from the photosensors are used to form an image of the scene.

The photosensors on a solid-state imager are capable of generating a signal that are representative of the amount of light striking the photosensor when the light striking the photosensor during the integration time is within a predefined range of illumination intensities. This range of illumination intensities is known as the dynamic range of the solid-state imager. The dynamic range of the solid-state imager is bracketed by a lower response threshold and an upper response threshold. The lower response threshold is set by the exposure level at which the inherent signal to noise properties of the sensor material and the electronic circuitry designed to extract stored information from the sensor approaches the inherent Poisson signal to noise ratio of the exposing light. The upper response threshold is set by the inherent charge-storage capacity of the photosensitive substrate, typically doped silicon. An introductory description of this problem appears in "Silver Halide and Silicon as Consumer Imagers," by R. P. Szajewski, J Image Sci. & Tech, Vol. 45, page 326 (2001).

The human eye is also has photoreceptors that are capable of detecting light that is within a range of illumination intensities. However, the dynamic range of solid-state imagers is less than the dynamic range of the human eye. Thus, what is needed is a solid-state imager and imaging system having a wider dynamic range.

One reason that solid state sensors lack the dynamic range of the photoreceptors of the human eye is that a large portion of the imaging surface of most solid state imagers is dedicated to regimes intended for interconnecting the individual photosensor areas, to regimes intended to act as drains for excessive charge and to insulation patterns electrically isolating the individual photosensors. Accordingly, a large proportion of light that is focused on the imaging surface strikes portions of the imaging surface that are not photosensitive. This wastes the energy from such light and causes such solid state sensors tend to have reduced ability to capture images of scenes having relatively low levels of illumination.

An approach for improving the sensitivity of solid state sensors is described in U.S. Pat. No. 4,667,092 entitled "Solid-state image device with resin lens and resin contact layer" filed by Ishihara on Dec. 22, 1993. In the '092 patent, individual micro-lenses are associated with individual photosensors on an imager. A distinct camera taking lens focuses light from a scene at a focal plane. The solid-state sensor and micro-lens are positioned at the focal plane. Each micro-lens collects light falling onto portions of the imager near a photosensor with which the micro-lens is associated and focuses the light onto the associated photosensor. This increases the useful sensitivity of the array and shifts the lower response threshold of the sensor so that the sensor array can capture images of scenes that have lower levels of illumination. The sensitivity enhancing micro-lenses of the '092 patent have been used to enhance the sensitivity of the CCD and CMOS sensors.

However, the upper response threshold experiences an equivalent shift which reduces the ability of the sensor array to capture differentiable images under higher illumination conditions. Thus, the sensitivity enhancing micro-lenses of the '092 patent shift but do not extend the dynamic range of the sensor.

Another approach for improving the dynamic range of solid state sensors is to adjust the integration time to compensate for different levels of scene illumination. In low illumination scenes, the integration time is extended, which permits more charge to accumulate in each photosensor and effectively shifts the dynamic range of the photosensor to a lower level. In higher illumination scenes, the integration time is reduced. This limits the amount of charge that accumulates at each photosensor to prevent over exposure. This approach maximizes the utility of the available dynamic range of the photosensor. However, this approach does not provide a solution for capturing electronic images of scenes in which there is a range of illumination conditions that are within the dynamic range of human vision but outside the dynamic range of the image sensor.

Yet another approach to improving the sensitivity of a solid state imager entails electronically "ganging" proximate photosensitive sites to increase the effective photon capture associated with the ganged sites while maintaining the charge storage to capacity of the ganged sites. This approach adventitiously provides for a limited increase in sensor dynamic range since the lower response threshold is dropped while the upper response cutoff is maintained. However, sensor resolution is greatly reduced.

Other attempts to improve the limited dynamic range of solid-state sensor arrays have also been made. One approach is to use an image sensor having a non-linear response to light from a photographic scene. For example, Fill Factory NV of Mechelen, Belgium has developed a solid-state sensor known as the "FUGA 1000" which has a logarithmic response to light from a scene. The non-linear response of the sensor permits image information to be obtained over an extended dynamic range. Such sensors have many useful applications. However, in certain circumstances a solid state sensor having a non-logorithm linear response is preferred.

In related art, U.S. Pat. No. 5,471,515 entitled "Active Pixel Sensor with Intra Pixel Charge Transfer" filed by filed by Fossum et al. on Jan. 28, 1994 and U.S. Pat. No. 5,841,126 entitled "CMOS Active Pixel Sensor Type Image System on A Chip" filed by Fossum et al. on Jan. 24, 1997 describe the integration of light sensitive structures and computational structures on a single complementary metal oxide semiconductor (CMOS) substrate to form a "camera-on-a-chip." These integrated devices potentially allow multiple image capture and digitization cycles per scene exposure. The images captured during these cycles can potentially be combined in digital space to create a single image with an apparent dynamic range that is greater than the actual dynamic range of the sensor. However, the CMOS sensors described in the '515 and '126 patents for the purposes described are noted for their poorer inherent dynamic range and their inherent high signal to noise ratio. Further, the process of capturing multiple sequential images can create problems where, for example, the content of the scene rapidly changes, thus making the approach suitable for static but not dynamic scenes requiring a fast shutter.

Meyers, in U.S. Pat. Nos. 5,676,371, 5,751,492, 5,731,899, 6,137,535, 6,141,048, 5,796,522, 5,822,125 and 5,812,322 describes the use of arrays of multiple small lenses as replacements for primary camera lenses in combination with known solid state sensors to enable highly compact cameras. Here, multiple sensor active sites are associated with each small-lens and the shortened focal length of the small lens enables the construction of highly miniaturized cameras by omission of the primary camera lens and associated optical train. The use of micro-lenses in these patents however, does not improve the dynamic range of the camera system, because each of the multiple lenses is employed as a conventional primary camera lens.

U.S. Pat. No. 6,381,072 entitled "Lenslet Array System and Method, filed by Berger et al. on Jul. 20, 2000, describes a structure useful in adapting a conventional film camera system for use as a digital image capture system. The camera system of the '072 patent employs multiple refractive and diffractive lenses to form a stacked array magnifiers (SAM) suitable for adapting a film camera for use with a smaller area solid-state sensor. The SAM is used because film cameras are typically adapted to focus light onto a segment of a photographic film that has an imaging surface are that is substantially larger that the imaging surface area of most solid state imagers. Accordingly, the SAM adjusts the size of the image formed by the optical system of the film camera so that the film camera forms an image at the solid state imager that conforms to the size of the electronic imager. However, the use of the SAM as described in the '072 patent does not enhance the dynamic range of the imager.

Thus, the problem of the limited dynamic range in solid state sensors and image capture systems that use such sensors has yet to be overcome and what is needed is a solid state imaging system having improved effective dynamic range.

SUMMARY OF THE INVENTION

In one aspect of the invention what is provided is an image sensor having an array of photosensors and an array of micro-lenses with each micro-lenses confronting more than one of the photosensors and concentrating light striking each micro-lens onto less than all of the confronted photosensors, so that selected photosensors receive a greater exposure than other photosensors.

In another aspect of the invention, an image capture system is provided. The image capture system has an image sensor comprising an array of photosensors and an array of micro-lenses with each micro-lens confronting more than one of the photosensors and concentrating light striking each micro-lens onto less than all of the confronted photosensors, so that selected photosensors receive a greater exposure than other photosensors. A taking lens unit focuses light from a scene onto the image sensor and an exposure control system an exposure control system controllably permitting the photosensors to receive light for a period of time. A processor extracts image information from the photosensors and forms an image based upon the extracted image information.

In another aspect of the invention, what is provided is a method for using an array of photosensors to capture an image of a scene. In accordance with the method, light from the scene is focused at the array of photosensors and light focused at groups of more than one of the photosensors is concentrated onto less than all of the photosensors of each group, so that selected photosensors in each group receive a greater exposure than other photosensors in the group. Image information from the photosensors and an image is formed using the extracted image information.

BRIEF DESCRIPTION OF THE DRAWINGS

FIG. 6A is a diagram useful in describing the relationship between scene exposure actual latitude and effective latitude.

FIG. 6B is a diagram useful in describing the effect of concentrated light on a photosensitive element.

FIG. 6C is a diagram useful in describing the effect of residual light on the photosensitive element.

DETAILED DESCRIPTION OF THE INVENTION

Figure 1:
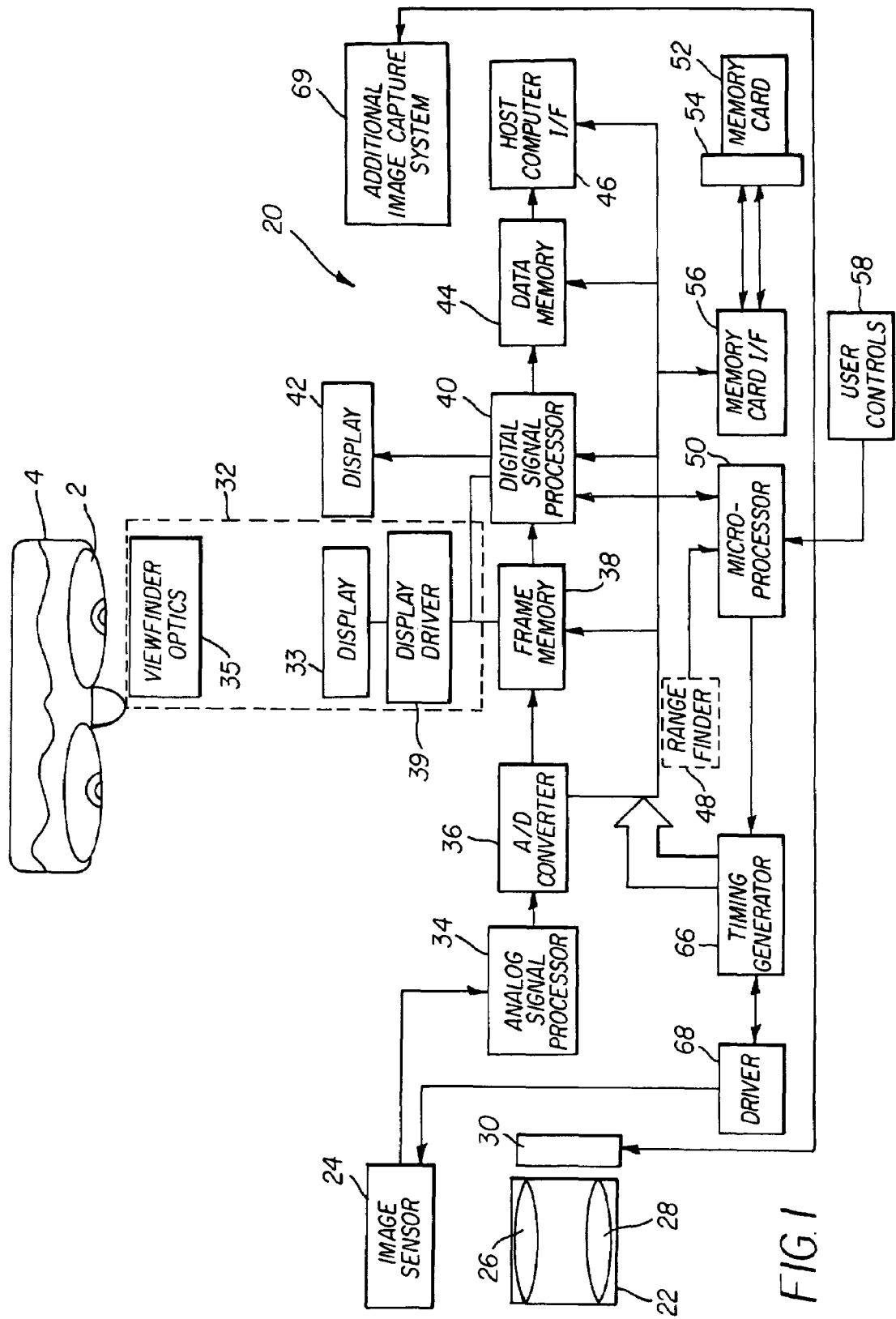
FIG. 1 is an illustration of one embodiment of an imaging system of the present invention.

FIG. 1 shows a block diagram of an embodiment of an imaging system 20 for capturing digital images. As is shown in FIG. 1, imaging system 20 includes a taking lens unit 22, which directs light from a subject (not shown) to form an image on an image sensor 24.

The taking lens unit 22 can be simple, such as having a single focal length with manual focusing or a fixed focus. In the example embodiment shown in FIG. 1, taking lens unit 22 is a motorized 2× zoom lens unit in which a mobile element or combination of elements 26 are driven, relative to a stationary element or combination of elements 28 by lens driver 30. Lens driver 30 controls both the lens focal length and the lens focus position. A viewfinder system 32 provides presents images captured by image sensor 24 to user 4 to help user 4 to compose images. The operation of viewfinder system 32 will be described in greater detail below.

Various methods can be used to determine the focus settings of the taking lens unit 22. In a preferred embodiment, image sensor 24 is used to provide multi-spot autofocus using what is called the "through focus" or "whole way scanning" approach. The scene is divided into a grid of regions or spots, and the optimum focus distance is determined for each image region. The optimum focus distance for each region is determined by moving taking lens system 22 through a range of focus distance positions, from the near focus distance to the infinity position, while capturing images. Depending on the camera design, between four and thirty-two images may need to be captured at different focus distances. Typically, capturing images at eight different distances provides suitable accuracy.

The captured image data is then analyzed to determine the optimum focus distance for each image region. This analysis begins by band-pass filtering the sensor signal using one or more filters, as described in commonly assigned U.S. Pat. No. 5,874,994 "Filter Employing Arithmetic Operations for an Electronic Synchronized Digital Camera" filed by xie et al., on Dec. 11, 1995, the disclosure of which is herein incorporated by reference. The absolute value of the bandpass filter output for each image region is then peak detected, in order to determine a focus value for that image region, at that focus distance. After the focus values for each image region are determined for each captured focus distance position, the optimum focus distances for each image region can be determined by selecting the captured focus distance that provides the maximum focus value, or by estimating an intermediate distance value, between the two measured captured focus distances which provided the two largest focus values, using various interpolation techniques.

The lens focus distance to be used to capture the final high-resolution still image can now be determined. In a preferred embodiment, the image regions corresponding to a target object (e.g. a person being photographed) are determined. The focus position is then set to provide the best focus for these image regions. For example, an image of a scene can be divided into a plurality of subdivisions. A focus evaluation value representative of the high frequency component contained in each subdivision of the image can be determined and the focus evaluation values can be used to determine object distances as described in commonly assigned U.S. Pat. No. 5,877,809 entitled "Method Of Automatic Object Detection In An Image", filed by Omata et al. on Oct. 15, 1996, the disclosure of which is herein incorporated by reference. If the target object is moving, object tracking may be performed, as described in commonly assigned U.S. Pat. No. 6,067,114 entitled "Detecting Compositional Change in Image" filed by Omata et al. on Oct. 26, 1996, the disclosure of which is herein incorporated by reference. In an alternative embodiment, the focus values determined by "whole way scanning" are used to set a rough focus position, which is refined using a fine focus mode, as described in commonly assigned U.S. Pat. No. 5,715,483, entitled "Automatic Focusing Apparatus and Method", filed by Omata et al. on Oct. 11, 1998, the disclosure of which is herein incorporated by reference.

In one embodiment, the bandpass filtering and other calculations used to provide autofocus in imaging system 20 are performed by digital signal processor 40. In this embodiment, imaging system 20 uses a specially adapted image sensor 24, as is shown in commonly assigned U.S. Pat. No. 5,668,597 entitled "Electronic Camera With Rapid Autofocus Upon An Interline Image Sensor", filed by Parulski et al. on Dec. 30, 1994, the disclosure of which is herein incorporated by reference, to automatically set the lens focus position. As described in the '597 patent, only some of the lines of sensor photoelements (e.g. only ¼ of the lines) are used to determine the focus. The other lines are eliminated during the sensor readout process. This reduces the sensor readout time, thus shortening the time required to focus taking lens unit 22.

In an alternative embodiment, imaging system 20 uses a separate optical or other type (e.g. ultrasonic) of rangefinder 48 to identify the subject of the image and to select a focus position for taking lens unit 22 that is appropriate for the distance to the subject. Rangefinder 48 operates lens driver 30, directly or as shown in FIG. 1 microprocessor 50 uses information from rangefinder 48, to move one or more mobile elements 26 of taking lens unit 22. Rangefinder 48 can be passive or active or a combination of the two. A wide variety of suitable multiple sensor rangefinders 48 known to those of skill in the art are suitable for use. For example, U.S. Pat. No. 5,440,369 entitled "Compact Camera With Automatic Focal Length Dependent Exposure Adjustments" filed by Tabata et al. on Nov. 30, 1993, the disclosure of which is herein incorporated by reference, discloses such a rangefinder 48.

A feedback loop is established between lens driver 30 and microprocessor 50 so that microprocessor 50 can accurately set the focus position of taking lens unit 22. The focus determination provided by rangefinder 48 can be of the single-spot or multi-spot type. Preferably, the focus determination uses multiple spots. In multi-spot focus determination, the scene is divided into a grid of regions or spots, and the optimum focus distance is determined for each spot.

Figure 2:
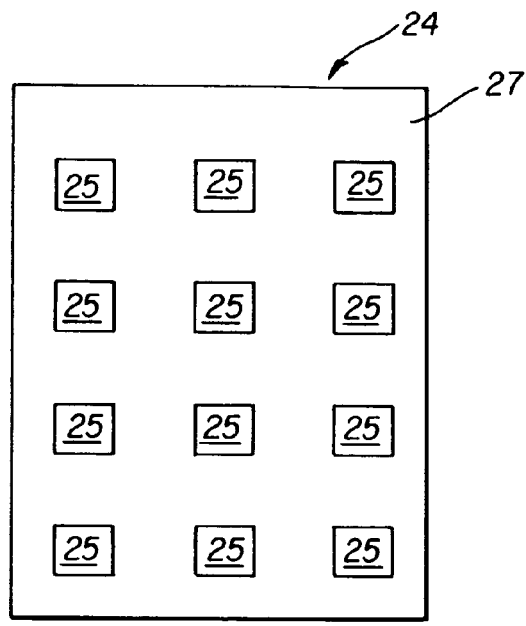
FIG. 2 schematically illustrates a face view of a solid state sensor of the prior art.

FIG. 2 shows a face view of image sensor 24. As can be seen in FIG. 2 image sensor 24 has a discrete number of photosensors 25 arranged in a two-dimensional array. Image sensor 24 can take many forms, for example image sensor 24 can be a conventional charge coupled device (CCD) sensor, a complementary metal oxide semiconductor (CMOS) image sensor and/or a charge injection device (CCD). In one example embodiment, image sensor 24 has an array of 1280× 960 photosensitive elements or photosensors 25. Photosensors 25 of image sensor 24 convert photons of light from the scene into electron charge packets. Each photosensor 25 is surrounded with inactive areas 27 such as isolation regions, interconnecting circuitry and useful structures known to those of ordinary skill in the art. Each photosensor 25 on image sensor 24 corresponds to one pixel of an image captured by image sensor 24, referred to herein as an initial image.

In one embodiment, where image sensor 24 is used to capture color images, each photosensor 25 is also is overlaid with a color filter array, such as the Bayer color filter array described in commonly assigned U.S. Pat. No. 3, 971,065, entitled "Color Imaging Array" filed by Bayer on Mar. 7, 1975, the disclosure of which is herein incorporated by reference. The Bayer color filter array has 50% green pixels in a checkerboard mosaic, with the remaining pixels alternating between red and blue rows. Each photosensor 25 responds to the appropriately colored incident light illumination to provide an analog signal corresponding to the intensity of illumination incident on the photosensor 25. Various other color filter arrays can be used. A color filter can be omitted where image sensor 24 is used to capture grey scale or so-called black and white images. In another embodiment, color images can be captured by wavelength specific color exposure depth interrogation as described by R. B. Merrill in U.S. Pat. No. 5,965,875 entitled "Color Separation in an Active Pixel Cell Imager Array Using a Triple Well Structure."

The analog output of each photosensor 25 is amplified by an analog amplifier (not shown) and analog processed by an analog signal processor 34 to reduce the output amplifier noise of image sensor 24. The output of the analog signal processor 34 is converted to a captured digital image signal by an analog-to-digital (A/D) converter 36, such as, for example, a 10-bit A/D converter which provides a 10 bit signal in the sequence of the Bayer color filter array.

The digitized image signal is temporarily stored in a frame memory 38, and is then processed using a programmable digital signal processor 40 as described in commonly assigned U.S. Pat. No. 5,016,107 entitled "Electronic Still Camera Utilizing Image Compression and Digital Storage" the disclosure of which is herein incorporated by reference. The image processing includes an interpolation algorithm to reconstruct a full resolution color initial image from the color filter array pixel values using, for example, the methods described in commonly assigned U.S. Pat. Nos. 5,373,322 entitled "Apparatus and Method for Adaptively Interpolating a Full Color Image Utilizing Chrominance Gradients" filed by LaRoche et al. on Jun. 30, 1993, and 4,642,678 entitled "Signal Processing Method and Apparatus for Producing Interpolated Chrominance Values in a Sampled Color Image Signal" filed by Cok on Feb. 3, 1986, the disclosures of which are herein incorporated by reference. White balance, which corrects for the scene illuminant, is performed by multiplying the red and blue signals by a correction factor so that they equal green for neutral (i.e. white or gray) objects. Preferably, color correction uses a 3×3 matrix to correct the camera spectral sensitivities. However, other color correction schemes can be used. Tone correction uses a set of look-up tables to provide the opto-electronic transfer characteristic defined in the International Telecommunication Union standard ITU-R BT.709. Image sharpening, achieved by spatial filters, compensates for lens blur and provides a subjectively sharper image. Luminance and chrominance signals are formed from the processed red, green, and blue signals using the equations defined in ITU-R BT.709.

Digital signal processor 40 uses the initial images to create archival images of the scene. Archival images are typically high resolution images suitable for storage, reproduction, and sharing. Archival images are optionally compressed using the JPEG standard and stored in a data memory 44. The JPEG compression standard uses the well-known discrete cosine transform to transform 8×8 blocks of luminance and chrominance signals into the spatial frequency domain. These discrete cosine transform coefficients are then quantized and entropy coded to produce JPEG compressed image data. This JPEG compressed image data is stored using the so-called "Exif" image format defined in "The Exchangeable Image File Format (Exif)" version 2.1, published by the Japan Electronics and IT Industries Association JEITA CP-3451. The Exif format archival image can also be stored in a memory card 52. In the embodiment of FIG. 1, imaging system 20 is shown having a memory card slot 54 which holds a removable memory card 52 and has a memory card interface 56 for communicating with memory card 52. An Exif format archival image and any other digital data can also be transmitted to a host computer (not shown), which is connected to imaging system 20 through a host computer interface 46. Host computer interface 46 can be for example, an optical, radio frequency or other transducer that converts image and other data into a form that can be conveyed to a host computer or network (not shown) by way of an optical signal, radio frequency signal or other form of signal.

Digital signal processor 40 also creates smaller size digital images based upon the initial images. These smaller sized images are referred to herein as evaluation images. Typically, the evaluation images are lower resolution images adapted for display on viewfinder display 33 or exterior display 42. Viewfinder display 33 and exterior display 42 can comprise, for example, a color liquid crystal display (LCD), organic light emitting display (OLED) also known as an organic electroluminescent display (OELD) or other type of video display.

In an image capture sequence, digital signal processor 40 can use the initial images to generate evaluation images, archival images or both. As used herein, the term "image capture sequence" comprises at least an image composition phase, an image capture phase and can optionally also include a verification phase.

During the composition phase, camera microprocessor 50 sends signals to a timing generator 66 indicating that images are to be captured. The timing generator 66 is connected generally to the elements of camera 20, as shown in FIG. 1, for controlling the digital conversion, compression, and storage of the image signal. The image sensor 24 is driven from the timing generator 66 via a sensor driver 68. Microprocessor 50, timing generator 66 and sensor driver 68 cooperate to cause image sensor 24 to collect charge in the form of light from a scene for an integration time that is either fixed or variable. After the integration time is complete an image signal is provided to analog signal processor 34 and converted into evaluation images as is generally described above.

A stream of initial images is captured in this way and digital signal processor 40 generates a stream of evaluation images based upon the initial images. The stream of evaluation images is presented on viewfinder display 33 or exterior display 42. User 4 observes the stream of evaluation images and uses the evaluation images to compose the image. The evaluation images can be created as described using, for example, resampling techniques such as are described in commonly assigned U.S. Pat. No. 5,164,831 "Electronic Still Camera Providing MultiFormat Storage Of Full And Reduced Resolution Images" filed by Kuchta et al., on Mar. 15, 1990, the disclosure of which is herein incorporated by reference. The evaluation images can also be stored in data memory 44.

Figure 3:
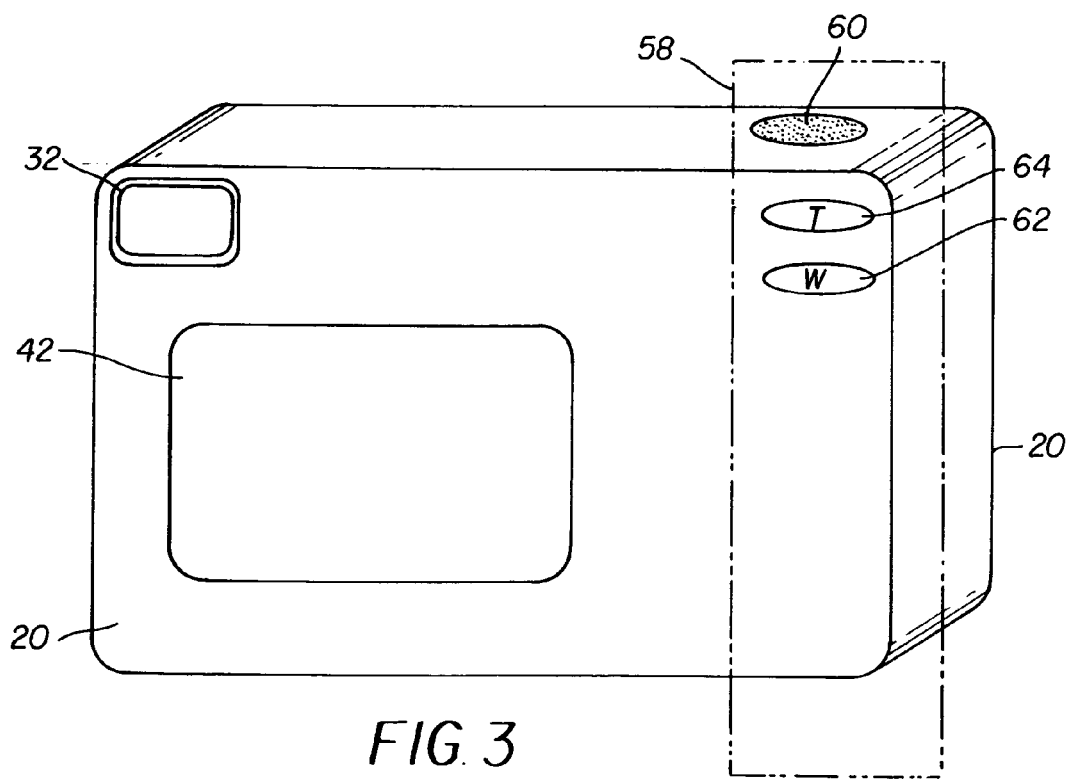
FIG. 3 is an illustration of a back view of the imaging system of FIG. 1.

Imaging system 20 typically enters the capture phase when user 4 depresses a shutter release 60 shown in FIG. 3. However the capture phase can also be entered in other ways, for example, in response to a timer signal or remote triggering system. During the capture phase microprocessor 50 sends a capture signal causing digital signal processor 40 to select an initial image and to process the initial image to form an archival image. During the verification phase, a corresponding evaluation image is also formed and, the corresponding evaluation image is supplied to viewfinder display 33 and/or exterior display 42 and is presented for a period of time. This permits user 4 to verify that the appearance of the captured archival image is acceptable.

In one alternative embodiment, the initial images that are captured by image sensor 24 are captured in the form of an archival images which are then modified for use as evaluation images. In another alternative embodiment, imaging system 20 has more than one system for capturing images. For example, in FIG. 1 an optional additional image capture system 69 is shown. This additional image capture system 69 can be used for capturing archival images. The additional image capture system 69 can comprise an image capture system that records images using a high resolution digital imager or a photographic element such as a film or plate. Where an additional image capture system 69 is used, the images captured by image sensor 24 can be used as the evaluation images.

Imaging system 20 is controlled by user controls 58, some of which are shown in more detail in FIG. 3. User controls 58 can comprise any form of transducer or other device capable of receiving input from user 4 and converting this input into a form that can be used by microprocessor 50 in operating imaging system 20. For example, user controls 58 can comprise touch screen input a way switch, a 6 way switch, an 8 way switch, a stylus system, track ball system, joy stick system, a voice recognition system, a gesture recognition system and other such systems. In the embodiment shown in FIG. 2, user controls 58 include user controls 58 include shutter release 60 that initiates image capture as is generally described above. A "wide" zoom lens button 62 and a "tele" zoom lens button 64, are provided which together control both a 2:1 optical zoom and a 2:1 digital zoom feature. The optical zoom is provided by taking lens unit 22, and adjusts the magnification in order to change the field of view of the focal plane image captured by the image sensor 24. The digital zoom is provided by the digital signal processor 40, which crops and resamples the captured image stored in the frame memory 38. When user 4 first turns on imaging system 20, the zoom lens is set to the 1:1 position, so that all sensor photoelements are used to provide the captured image, and the taking lens unit 22 is set to the wide angle position. In a preferred embodiment, this wide angle position is equivalent to a 40 mm lens on a 35 mm film camera. This corresponds to the maximum wide angle position.

When user 4 then depresses the "tele" zoom lens button 64, taking lens unit 22 is adjusted by camera microprocessor 50 via the lens driver 30 to move taking lens unit 22 towards a more telephoto focal length. If user 4 continues to depress the "tele" zoom lens button 64, the taking lens unit 22 will move to the full optical 2:1 zoom position. In a preferred embodiment, this full telephoto position is equivalent to a 40 mm lens on a 35 mm film camera. If user 4 continues to depress the "tele" zoom lens button 64, the taking lens unit 22 will remain in the full optical 2:1 zoom position, and digital signal processor 40 will begin to provide digital zoom, by cropping (and optionally resampling) a central area of the image. While this increases the apparent magnification of the camera, it causes a decrease in sharpness, since some of the outer photoelements of the sensor are discarded when producing the archival image. However, this decrease in sharpness would normally not be visible on the relatively small viewfinder display 33 and exterior display 42.

For example, in imaging system 20 of FIG. 1, the captured image is derived from a high resolution image sensor 24, having for example 1280×960 photosensors, corresponding to about 1.25 megapixels. The term resolution is used herein to indicate the number of picture elements used to represent the image. Exterior display 42, however, has lower resolution providing, for example, 320×240 elements, which correspond to about 0.08 megapixels. Thus, there are 16 times more sensor elements than display elements. Accordingly, it is necessary to resample the initial image into an evaluation image having a suitably small image size so that it can properly fit on viewfinder display 33 or exterior display 42. This resampling can be done by using low pass filtering, followed by subsampling, or by using bilinear interpolation techniques with appropriate anti-aliasing conditioning. Other techniques known in the art for adapting a high resolution image for display on a relatively low resolution display can alternatively be used.

The resampling of the captured image to produce an evaluation image having fewer pixels (i.e. lower resolution) than the captured image is performed by digital signal processor 40. As noted earlier, signal processor 40 can also provide digital zooming. In the maximum 2:1 setting, signal processor 40 uses the central 640×480 sensor area to provide the archival image by interpolating this central area up to 1280× 960 samples.

Digital signal processor 40 can also modify the evaluation images in other ways so that the evaluation images match the appearance of a corresponding archival image when viewed on viewfinder display 33 or exterior display 42. These modifications include color calibrating the evaluation images so that when the evaluation images are presented on a viewfinder display 32 or exterior display 42, the displayed colors of the evaluation image appear to match the colors in the corresponding archival image. These and other modifications help to provide user 4 with an accurate representation of the color, format, scene content and lighting conditions that will be present in a corresponding archival image.

As noted above, because evaluation images are displayed using an electronic display that has lower resolution than a corresponding archival image, an evaluation image may appear to be sharper when viewed through viewfinder display 33 or exterior display 42 than it will appear when the archival image is printed or otherwise displayed at higher resolution. Thus, in one optional embodiment of the present invention, each evaluation image can be modified so that areas that will appear out of focus in a corresponding archival image could appear to be out of focus when viewed on an electronic display such as exterior display 42. Moreover, when the digital zoom is active, the entire image is softened, but this softening would normally not be visible in exterior display 42. For the example in imaging system 20 of FIG. 1, exterior display 42 can be a display having 320×240 pixels while the archival image is provided using a sensor area of 640×480 pixels in the maximum digital zoom setting. Thus, the evaluation image displayed on exterior display 42 after normal resizing will appear suitably sharp. However, the archival image will not produce an acceptably sharp print. Therefore, a resampling technique can be used which creates an evaluation image having 320×240 pixels, but having reduced apparent sharpness when the maximum digital zoom setting is used.

It will be appreciated that the apparent sharpness of a print or other tangible output that is made from the archival image is also a function of the size of the rendered image. As described in commonly assigned U.S. patent application Ser. No. 10/028,644 entitled "Method and Imaging system for Blurring Portions of a Verification Image To Show Out of Focus Areas in a Captured Archival Image", filed by Belz, et al. on Dec. 21, 2001, imaging system 20 can optionally have an input (not shown) for receiving a signal indicating the expected size of the output and can adjust the apparent sharpness of the evaluation image accordingly and/or provide a warning.

The dynamic range enhancing features of imaging system 20 will now be described with reference to FIGS. 4 and 5. As is shown in FIGS. 4 and 5, imaging system 20 with image sensor 24 also includes an array 70 of dynamic range enhancement micro-lenses 72.

Figure 4:
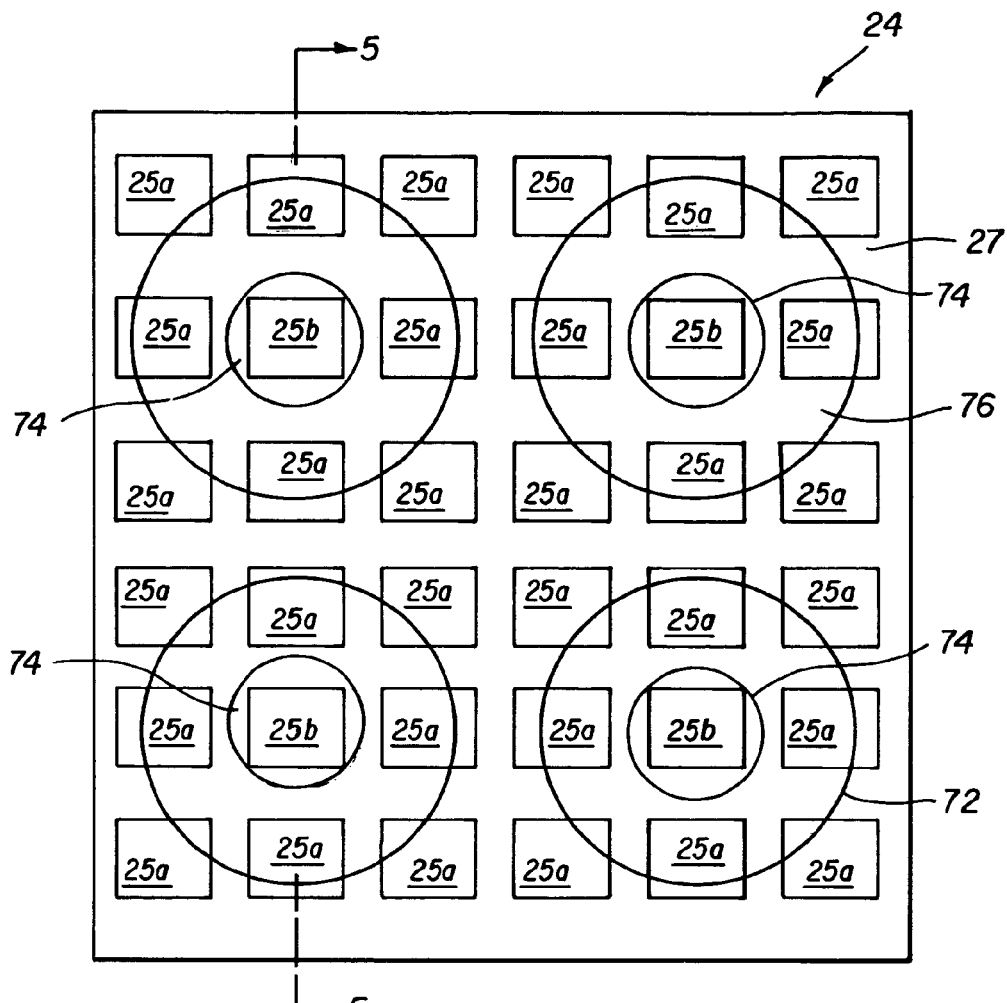
FIG. 4 is an illustration of a face view of an image sensor having a sensitivity enhancing array of micro-lenses.

FIG. 4 schematically illustrates a face view of one embodiment of an image sensor 24 according to the invention. As is shown in FIG. 4, image sensor 24 has photosensors 25, and light non-responsive inactive areas 27, such as isolation regimes, drains and interconnectivity regions. The projection of micro-lenses 72 is shown relative to the photosensors 25.

Figure 5:
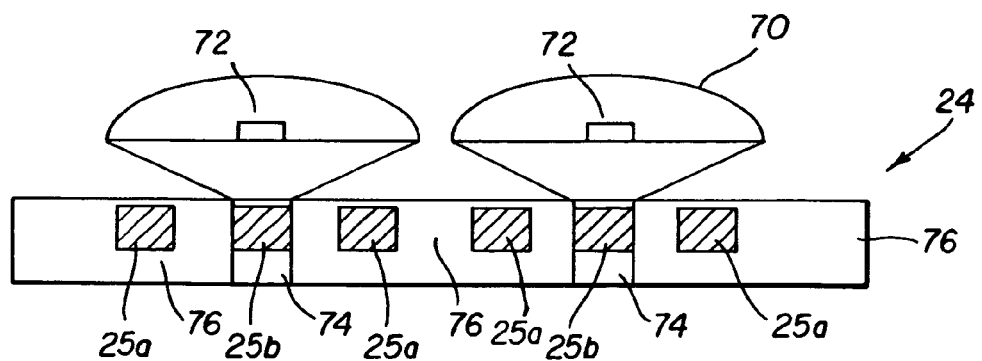
FIG. 5 is a side illustration of one embodiment of an image sensor and array of micro-lenses shown in FIG. 4.

As is shown in FIG. 5, light from a scene striking each micro-lens 72 is focused at an associated concentrated image area 74 of the image sensor 24. At least one photosensor 25b is positioned within each concentrated image area 74 associated with each dynamic range enhancement micro-lens 72. Photosensors 25b within each concentrated image area 74 receive enhanced exposure thereby increasing the effective sensitivity of photosensors 25b within the concentrated image area 74. This makes it possible to image dark scene elements such as scene shadows. Photosensors 25a that are outside of concentrated image area 74 are located in residual image areas 76. Photosensors 25a receive a reduced exposure. This is because a portion of the light that would have traveled to photosensors 25a in the residual image areas 76 is focused by micro-lenses 72 onto concentrated image areas 74. This effectively filters the amount of light passing to the photosensors 25a in the residual image areas 76 reducing the effective sensitivity of photosensors 25a. Thus micro-lens 72 concentrates light at concentrated image area 74 and enhances the exposure at photosensitive area 25b while retarding the exposure of residual image area 76 and reducing exposure at photosensitive area 25a.

The operation of this system can be explained with reference to FIGS. 6A, 6B and 6C. As is shown in FIG. 6A, light from a photographic scene extends, over a wide range of scene luminances. In the case of consumer photography, these are typically the luminances that are visually observable by humans. This range is indicated in FIG. 6A as scene luminance range 80. However, each photosensor 25 on image sensor 24 has an actual latitude 82 within which the photosensor 25 can capture differences in scene illumination and record a contrast image of the scene. Because of the inherent limitations of solid-state image capture technology and the specific response of the photosensor 25 to illumination from the scene, the actual latitude 82 of each photosensor 25 is defined by a lower response threshold 84 and an upper response threshold 86 as described in the above. Photosensor 25 does not differentiably react to scene illumination differences when photosensor 25 is exposed to quantities of light that are lower than the lower response threshold 84. This is in part because the amount of charge stored at the photosensor 25 during an image capture sequence can be so low as to be indistinguishable from errant electrical interference or other noise that can become involved with signals transmitted from the imager. This effect practically occurs when the signal to noise ratio of the exposure matches the inherent dark signal to noise ratio of the image sensor 24.

Similarly, photosensor 25 does not differentially react to scene illumination differences when element 30 is exposed to quantities of light that are higher than the upper response threshold 86. As noted in greater detail above, this is because the amount of light received by photosensor 25 above upper response threshold 86 is sufficient fill the charge storage capacity of photosensitive elements 25 of image sensor 24 so that photosensor 25 no longer has a meaningful additional response to additional light energy. Because of this, all photosensors 25 that are exposed to such quantities of light cease to record meaningful differences in scene content.

However, as is also shown in FIG. 6A, it is desirable that camera 20 and image sensor 24 should record scene information at a desired latitude 88 having lower response threshold 90 that is lower than the lower response threshold 74 of photosensors 25 of image sensor 24. Photography in this range of illumination is made possible by concentrating light from the scene. In this regard, each of the dynamic range enhancing micro-lenses 72 in array 70 fractures light from the scene into at least two portions. A concentrated fraction of light from the scene is concentrated so that a greater amount of light per unit area falls upon each of the photosensors 25b within the concentrated image areas 74 during a selected integration time than would fall upon photosensors 25b within the concentrated image areas 74 in the absence of the array 70 of dynamic range enhancing micro-lenses 72.

As is shown in FIG. 6B, this increase in the amount of light incident upon photosensors 25b within concentrated image areas 74 has the effect of shifting a first range 94 of scene exposure levels so that the entire first range 94 is within actual photosensor latitude 82 allowing photosensors 25b within the concentrated image are 74 record an image.

As is shown in FIG. 6C, some of the light incident micro-lenses 72, for example light that is poorly focused by micro-lenses 72 or light that passes between distinct ones of micro-lenses 72, is not concentrated. Instead, this residual fraction of the light passes to image sensor 24 and is incident on photosensors 25a or residual image area 76 enabling formation of a residual image. The residual image can further be formed by designed or adventitious light scatter and reflection at image sensor 24. The residual fraction of light that strikes residual image area 76 during an integration time is less than the amount of light that would be incident on residual image area 76 in the event that array 70 of micro-lenses 72 was not interposed between a scene and the image sensor 24 during the same integration time. Thus, micro-lenses 72 effectively filter light from the scene that is incident on residual image area 76 so that a greater quantity of light must be available during the integration time in order for photosensors 25a within the residual image area 76 to receive sufficient illumination to form an image. Accordingly, the integration time used to obtain images from image sensor 24 is typically sufficient to form an image on the residual image area 76 of the image sensor 24 when light from the scene is within a second exposure range 96.

As is shown in FIG. 6C, when the micro-lenses 72 of array 70 are exposed to light within second exposure range 96, a second exposure suitable for producing an image i.e. within the actual latitude 82 of photosensors 25 is formed on photosensors 25a in the residual image area 76. In this way, image sensor 24 can be used to record differentiable images at exposure levels that are above the upper response threshold 86 of the photosensors 25 of image sensor 24 but below a desired system upper response threshold 92.

A region of overlap can be defined between first exposure range 94 and second exposure range 96. Where it is desired to greatly increase system latitude 88, this region of overlap can be contracted. In one embodiment, the ability to capture image information from photosensors 25 within either concentrated image areas 74 or residual image areas 76 over a continuous system latitude 88 is ensured by defining a substantial range of exposures wherein first exposure range 94 and second exposure range 96 overlap. Alternatively, it may be preferred to provide an imaging system 20 wherein there is substantial separation between first exposure range 94 and second exposure range 96. An imaging system 20 having such a substantial separation would effectively operate to capture different images under very different imaging conditions such as daylight and interior light.

Image sensor 24 of the invention comprises an array of photosensors 24 and an array 70 of micro-lens 72 each confronting more than one photosensor. Each micro-lens 72 focuses a portion of the light striking micro-lenses 72 onto less than all of the confronted photosensors 25 so that photosensors 25b receive a greater exposure than other photosensors 25a during an integration time. It will be appreciated that the fraction of photosensors 25b receiving micro-lens focussed light, to enable latitude 94, and the other fraction receiving effectively filtering light, to enable latitude 96, light will influence the portion of the image that is shifted in exposure space as discussed in detail in relation to FIGS. 6A, 6B and 6C above. The ratio of exposure enhanced photosensors 25b to other photosensors 25a is related to the magnitude of the overall shifts in exposure space. This proportion will also influence the resolution and overall image structure capabilities in each exposure region.

In one embodiment, the ratio of the number of photosensors to the number of micro-lenses is at least 1.5 to 1. In another embodiment, the ratio can be at least 2 to 1. In further embodiments the ratio can be at least 5 to 1, and at least 9 to 1. Additionally, in one embodiment the ratio of the number of photosensors to the number of micro-lenses can be no greater than 1000 to 1. In another embodiment, this ratio is no greater than 100 to 1. In still another embodiment, this ratio can be no greater than 20 to 1. Further, the structure of the micro-lens array 70 and the dimensions of the micro-lens 72 relative to the layout of the sensor array 24 can be such that the exposure of some individual photosensor sites 25 are not influenced by the micro-lenses 72. This embodiment provides a proportion of photosensors 25 that are not shifted in exposure space, thereby preserving latitude 82. In a useful embodiment, the fraction of photosensors 25b positioned to receive focused light on exposure and the fraction of other photosensors 25b positioned to receive residual light on exposure constitute at least 25% of all the photosensors. In a preferred embodiment, the fraction of photosensors positioned to receive focused light on and the fraction of exposure 25b photosensors on exposure constitute at least 50% of all the photosensors. While in another embodiment, the fraction of photosensors 25b positioned to receive focused light on exposure and the fraction of other photosensors 25a positioned to receive retarded light on exposure constitute at least 75% of all the photosensors.

It will be appreciated that when an exposure level is in the second exposure range 96 and the first exposure range 94 and second exposure range 96 at least partially overlap, photosensors 25b may also contain useful imaging information. Under these circumstances image information can be obtained from photosensors 25b. However, where the exposure is above the first exposure range 94 then photosensors 25b in concentrated image areas 74 will be fully exposed and will not contain any differentiable image information.

It will be further appreciated that while this discussion has been framed in terms of a specific embodiment directed towards image capture intended for capturing human visible scenes, the invention can be readily applied to capture extended scene luminance ranges and spectral regions invisible to humans and the solid state image sensor can be any solid state image known to the art that has the requisite imaging characteristics. The effective increase in latitude enabled can be at least 0.15 log E. In certain embodiments, the effective increase in latitude can be between at least 0.3 log E and 0.6 log E. In other embodiments, the effective increase in latitude is at least 0.9 log E.

Figure 7A:
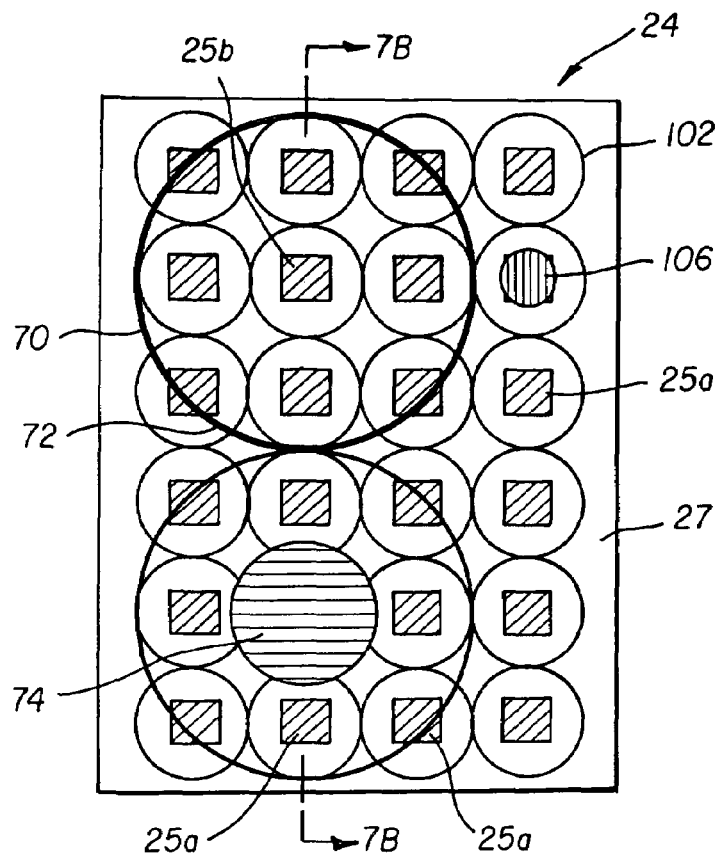
FIG. 7A schematically illustrates a face view of an image sensor of the invention.
Figure 7B:
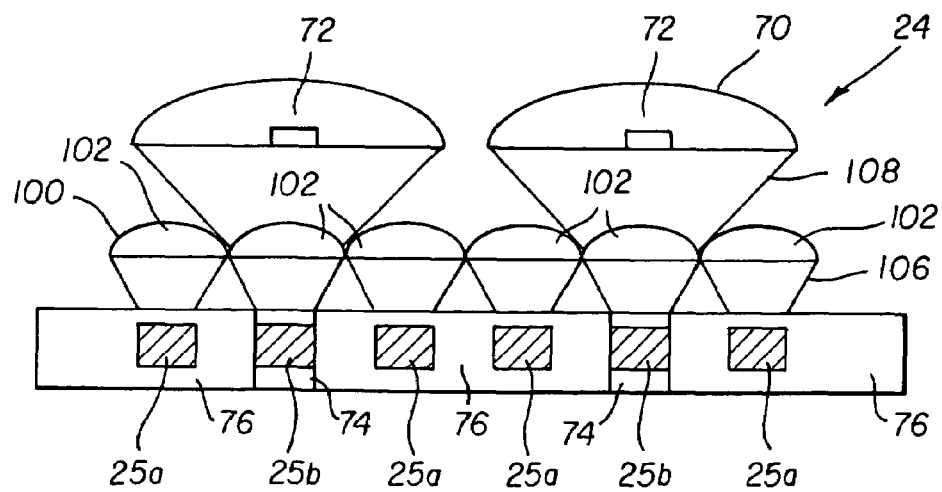
FIG. 7B schematically illustrates a side view of the embodiment of FIG. 7A.

FIG. 7A schematically illustrates a face view of another embodiment of the image sensor. Here an array 100 of sensitivity enhancing micro-lenses 102 is provided to reduce amount of light that is allowed to strike light insensitive areas 27. Array 100 positions each micro-lens 102 in association with one photosensor 25. This optional feature is known in the art and is described in greater detail in the '092 patent described above. As can be seen in this embodiment, sensor 24 comprises both an array 70 of micro-lenses 72 and an array 100 of sensitivity enhancing micro-lenses 102. FIG. 7B schematically illustrates a side view of the embodiment of FIG. 7A. As is shown in FIGS. 7A and 7B individual micro-lenses 102 enhance the response of each photosensitive area 25 by concentrating light 106 at the individual photosensors 25. The larger micro-lenses 72, however, act to concentrate light 108 at specific ones of the sensitivity enhancing micro-lenses 102 and associated photosensors 25b, in concentrated image area 74 while allowing residual light to fall onto other ones of the micro-lenses 102 and associated photosensors 25a, in residual image areas 76 thereby increasing the luminance range recording capability of image sensor 24. Thus, in this embodiment, the sensitivity of the photosensors 25 is enhanced by micro-lenses 102 while the dynamic range is enhanced by using micro-lenses 72.

Figure 8D:
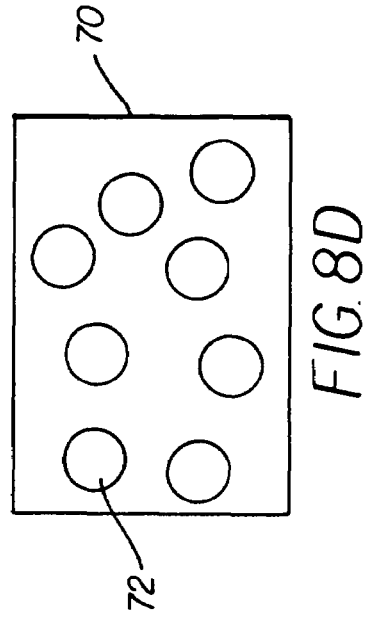
FIGS. 8A-8E show various diagrams illustrating embodiments of an array of micro-lenses useful in practicing the present invention.
Figure 8E:
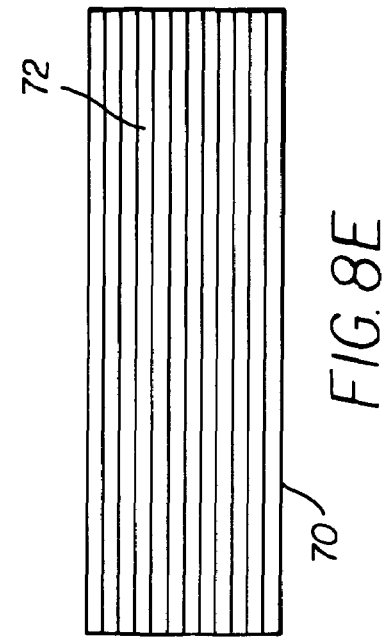
Figure 8A:
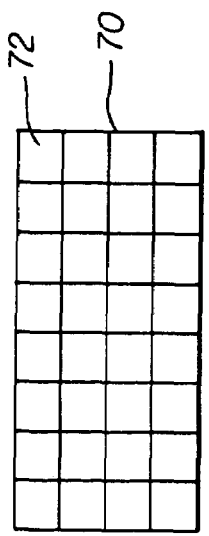
Figure 8B:
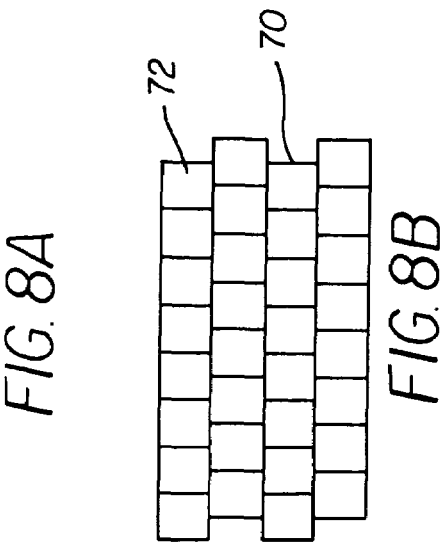
Figure 8C:
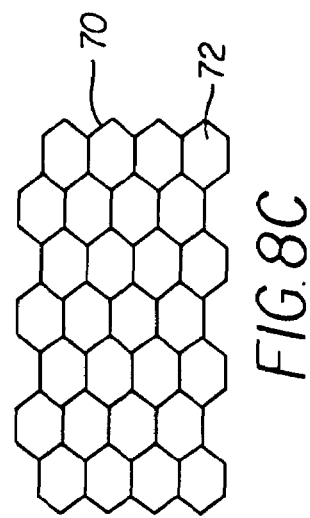

In the embodiment described above, micro-lens array 70 has been shown as comprising a cubic, close packed lenticular array of circular dynamic range enhancing micro-lenses 72. This arrangement results in the concentration of light in the manner described above. In this embodiment, micro-lenses 42 can have a uniform cross-sectional area. FIG. 8A shows, conceptually, a dynamic range enhancing micro-lens array 70, of micro-lenses 72 arranged in this uniform cubic close packed distribution pattern by a support 78. It will be appreciated that other array patterns can be used. For example, FIG. 8B shows an embodiment having an off-set square close packed array pattern. In another embodiment shown in FIG. 8C dynamic range enhancing micro-lenses 72 are arranged in an array 70 having a hexagonal close packed array pattern. Array 70 can also feature random distributions of dynamic range enhancing micro-lenses 72. One embodiment of an array having a random distribution is shown in FIG. 8D. As is shown in FIG. 8E, in still another embodiment, array 70 can comprise an array of cylindrical or acylindrical dynamic range enhancing micro-lenses 72.

Figure 9A:
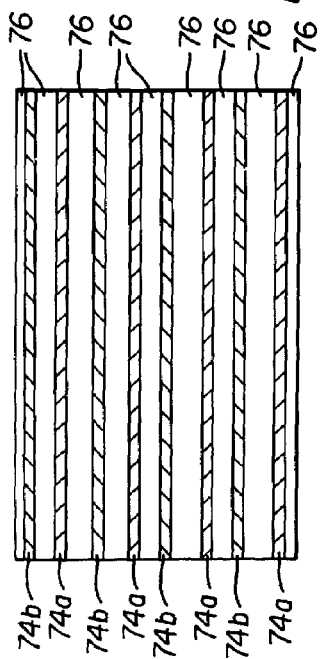
FIGS. 9A-9C show diagrams illustrating various embodiments of arrays of different micro-lenses that can be usefully combined in a single array of micro-lenses.
Figure 9B:
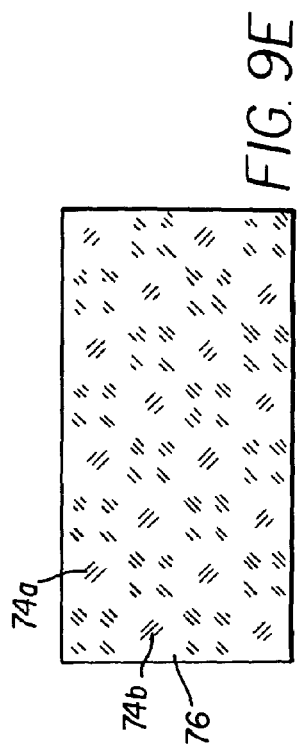
Figure 9C:
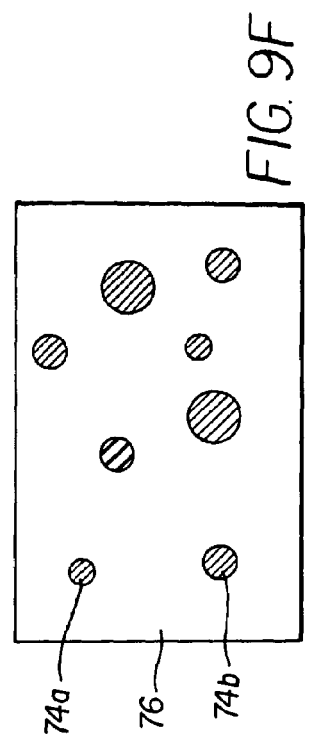
Figure 9D:
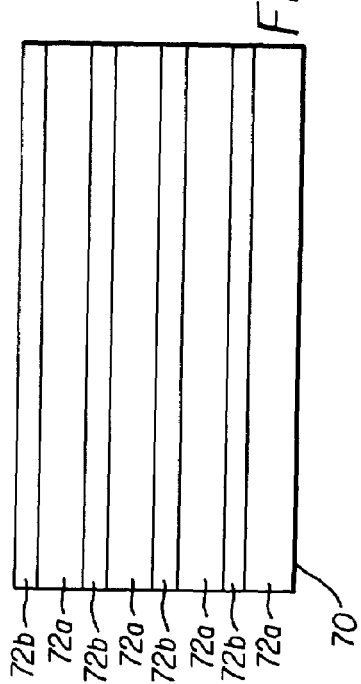
FIGS. 9D-9F show diagrams illustrating patterns formed on an image sensor by imagewise exposure of the image sensor to light from a scene passing through, respectively, the arrays of FIGS. 9A-9C.
Figure 9E:
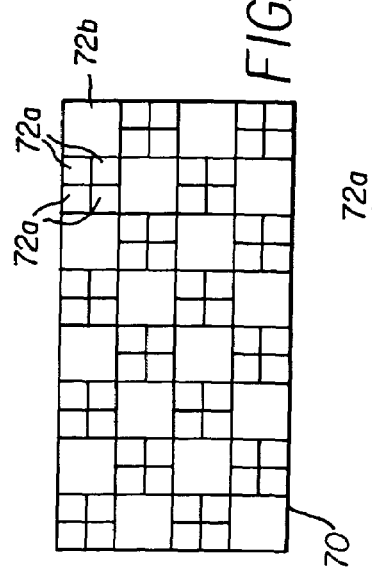
Figure 9F:
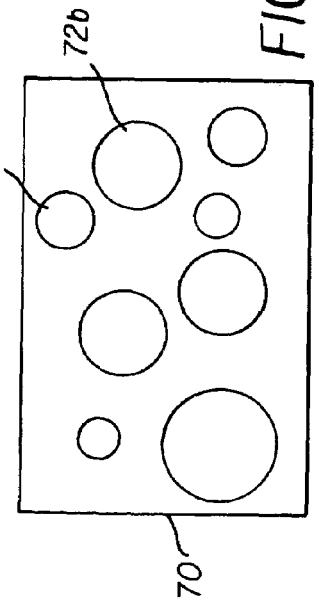

As is shown in FIGS. 9A, 9B and 9C, micro-lens array 70 can comprise dynamic range enhancing micro-lenses 72 having different optical characteristics. In the embodiment of FIG. 9A, a micro-lens array 70 of cylindrical dynamic range enhancing micro-lenses 72 is shown. As is shown in FIG. 9A, micro-lens array 70 has a first set of micro-lenses 72a that have a greater cross-section area than a second set of micro-lenses 72b also provided by micro-lens array 70. In this embodiment, the first set of micro-lenses 72a concentrate a greater portion of light during an exposure than micro-lenses 72b. Thus, the first set of micro-lenses 72a form a line image on image sensor 24 as shown in FIG. 9D, in a first set of concentrated image areas 74a, when the amount of the light during the exposure is within a first exposure range 84. When a light from the scene within a second exposure range 86, the second set of micro-lens array 72b form a line image on image sensor 24 in a second set of concentrated image areas 74b. Light that is not concentrated by either set of micro-lenses 72a and 72b can form a residual image (not shown) in residual image area 76 of image sensor 24 of FIG. 9D. Similarly, FIGS. 9B and 9C each show the use of a micro-lens array 40 having differently sized sets of micro-lenses 72a and 72b with the micro-lens array 40a concentrating light to form an exposure and directing that light onto concentrated image areas 74a when light from the scene is within a first range. Micro-lenses 72b concentrate light from a scene and direct this light onto concentrated image areas 74b to form an exposure when the light from the scene is within a second range. Here too, residual portions of the light are recorded in residual image areas 76. Thus, in these embodiments of FIGS. 9A-9C the effective latitude of the image sensor 24 can be further extended.

As is shown in FIG. 9C, the surface coverage of micro-lenses 72 does not have to be maximized. While any useful surface coverage of micro-lenses 72 can be employed, the ratio of the projected area of the micro-lenses 72 to area of image sensor 24 occupied by the photosensors 25 can be at least 20 percent. In one embodiment, the coverage can be between at least 50 percent and up to 85 percent. In another embodiment, surface coverage of 85 percent up to the close-packed limit can be used. The precise degree of surface coverage can be adjusted to enable varying levels of exposure latitude while maintaining useful image quality. In any embodiment where the surface coverage is less than the close packed limit, support 78 can be defined to allow residual light to pass to image sensor 24.

Array 70 can comprise a set of individual micro-lenses 72 that are formed together or joined together, for example by extrusion, injection molding and other conventional fabrication techniques known to those in the art. Array 70 can also be formed by combining a plurality of separate micro-lenses 72 fixed together by mechanical or chemical means or by mounting on support 78. Array 70 can comprise a set of lenticular beads or spheres (not shown) that are positioned proximate to or coated onto image sensor 24 or otherwise joined to image sensor 24. Micro-lenses 72 may be formed in any matter known in the microstructure art. Micro-lenses 72 may be unitary with image sensor 24, as for example by being embossed directly into image sensor 24 at manufacture or they may be integral to a distinct layer applied to image sensor 24. In still other embodiments, on array 70 of micro-lenses 72 can be formed using a photosensitive coating.

The dimensions of imaging system 20 and the detailed characteristics of the taking lens system 22 dictate the exposure pupil to image distance, i.e. the camera focal length. Preferably, an image is formed at the array 70 of micro-lenses 42. The characteristics of micro-lenses 72 dictate their focal length. The micro-lens images are formed at the light sensitive areas of image sensor 24. The f-number of taking lens system 22 controls the depth-of-focus and depth-of-field of imaging system 20 while the micro-lens f-number controls the effective aperture of imaging system 20. By using a taking lens system 22 having a stopped down f-number, excellent sharpness along with wide depth of focus and depth of field are obtained. By using an opened f-number for micro-lens array 72, high system speed is obtained.

Accordingly, a useful combination of taking lens system 22 and micro-lenses 72 f-numbers will be those that enable system speed gains. System speed gains of more than 0.15 log E, or ½-stop, are useful, while system speed gains 0.5 log E or more are preferred. While any micro-lenses 72 having an f-number that enables a speed gain with taking lens unit 22 having adequate depth-of-field for an intended purpose can be gainfully employed, typically micro-lenses 72 having f-numbers of 1.5 to 16 are useful. In certain embodiments, micro-lenses 72 having f-numbers in the range of f/2 to f/7 are useful. In other embodiments, micro-lenses 72 having f-numbers in the range of f/3 to f/6 are preferred.

Figure 10A:
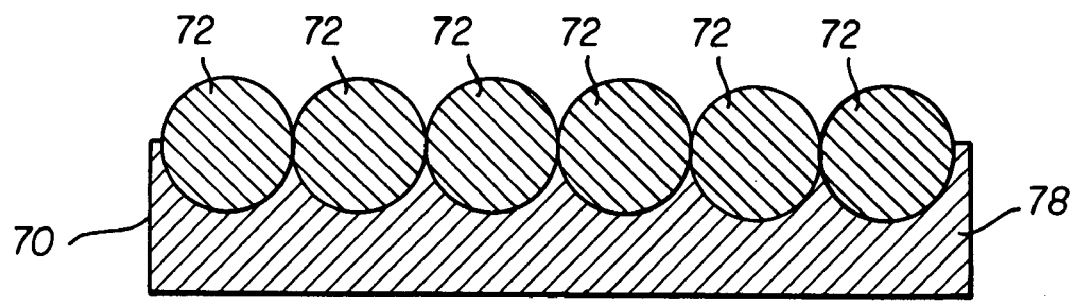
FIG. 10A-10C show cross-section illustrations of arrays of micro-lenses, spherical and aspherical lenses.
Figure 10B:
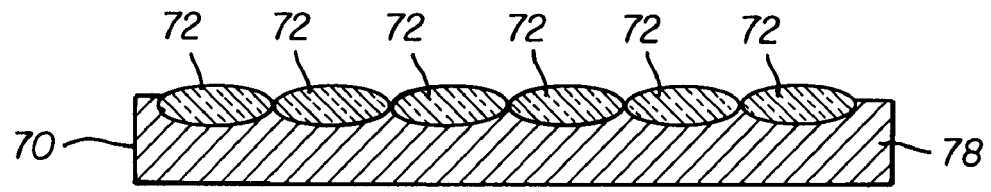
Figure 10C:
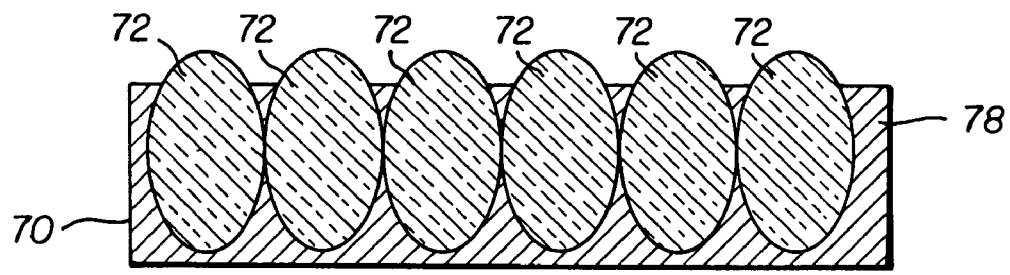

The individual micro-lenses 72 are convergent lenses in that they are shaped so as to cause light to converge or be focused. As such, they form convex projections from the support 78. The individual projections are shaped as portions of perfect or imperfect spheres. Accordingly, micro-lenses 72 can be spherical portion lenses or they can be aspherical portion lenses. Both types of micro-lenses can be simultaneously employed. A spherical portion micro-lens 72 has the shape and cross-section of a portion of a sphere. An aspherical portion micro-lens 72 has a shape and cross-section of a flattened or elongated sphere. The lenses are micro in the sense that they have a circular or nearly circular projection. Any useful lens diameter consistent with the operation of the invention as described and the dimensions of known solid state imager arrays can be usefully employed. In one embodiment micro-lenses 72 with a diameter of between 1 and 1000 microns are used. A cylindrical portion micro-lens 72 has the shape and cross-section of a portion of a cylinder. An acylindrical portion micro-lens 72 has a shape and cross-section of a flattened or elongated cylinder. FIGS. 10A-10D show a cross-sectional view of micro-lenses 72 mounted in a support 78 and exhibiting example embodiments of various spherical and aspherical micro-lenses 72. FIG. 10A shows an embodiment wherein micro-lenses 72 comprise spherical lenses joined by support 78. FIGS. 10B and 10C show embodiments of micro-lens array 70 having spherical micro-lenses 72. It is appreciated that any of the above described array patterns may be combined with aspherical micro-lenses 72 to provide extended latitude. Further, any of the patterns of micro-lenses 72 can be applied in a non-close packed manner to enable extended photographic latitude.

Micro-lenses 72 are shown with distinct hatching to illustrate the spherical and aspherical character of the protruding portion that actually forms the micro-lens. Aspherical micro-lenses 72, of the type shown in FIGS. 10B and 10C, are especially useful for this application in that the variable radius of such lenses allows for control of the lens focal length and lens aperture nearly independently of the spacing between the micro-lenses and photosensors 25. While these cross-sections have been described as spherical or aspherical, it is fully appreciated that the diagrams equally represent in cross-section cylindrical or acylindrical micro-lenses 72.

The light concentration or useful photographic speed gain on concentrating light focused by taking lens system 22 with a circular projection micro-lens 72 is the square of the ratio f-numbers of imaging system 20 and the micro-lenses 72. Speed gain (in log relative Exposure) in such a system can be determined as the speed gain equals 2×log (camera lens f-numbers/micro-lens f-numbers). The light concentration or useful photographic speed gain of cylindrical micro-lenses allow the square root of such an improvement because they concentrate light in only one direction. The concentration of light by micro-lens array 70 enables both a system speed gain and forms an exposure pattern image sensor 24.

Preferred design parameters for micro-lenses 72 and their relationship to the photosensors 25 of image sensor 24 follow from these definitions:

Micro-lens radius is the radius of curvature of the hemispheric protrusion of micro-lenses 72. For aspherical micro-lenses 72 this value varies across the surface of the micro-lens.

Micro-lens aperture is the cross sectional area formed by the micro-lens typically described as a diameter. For spherical micro-lenses this diameter is perforce less than or equal to twice the micro-lens radius. For aspherical micro-lenses this diameter can be greater than twice the smallest radius encountered in the micro-lens. Use of differently sized micro-lenses having distinct apertures enables distinct levels of speed gain on a micro-scale and thus enables extended exposure latitude for a photosensitive site.

Micro-lens focal length is the distance from micro-lenses 72 to photosensitive sites 25 of image sensor 24.

Micro-lens f-number is the micro-lenses 72 aperture divided by the micro-lens focal-length. For spherical micro-lenses 72, the desired micro-lens focal length can be used to define an appropriate micro-lens radius following a lens equation, thusly:

Micro-lens radius is the micro-lens focal-length times $(n_2-n_1)/n_2$; where $n_1$ is the refractive index of the material outside the micro-lens (typically air with a refractive index of unity) while $n_2$ is the refractive index of the micro-lens and any contiguous transmissive material e.g. (plastics as used in array support 90.) The useful plastics or polymers typically have a refractive index of 1.4 to 1.7). The ratio of the highest to the lowest refractive index can be between 0.8 and 1.2. In preferred embodiments the ratio is between 0.95 and 1.05. Following the known refractive indices of typical photographic system components, useful spherical micro-lenses will have a micro-lens focal length about 3 times the micro-lens radius $((n_2-n_1)/n_2 \sim 1/3)$. Non-integral micro-lenses 72 can be made from a wider variety of plastics and glasses. For micro-lenses 72 that are integrally formed on image sensor 24, superior optical properties are provided when the refractive index of the materials used to form the composite optical device are as similar as possible.

Figure 11:
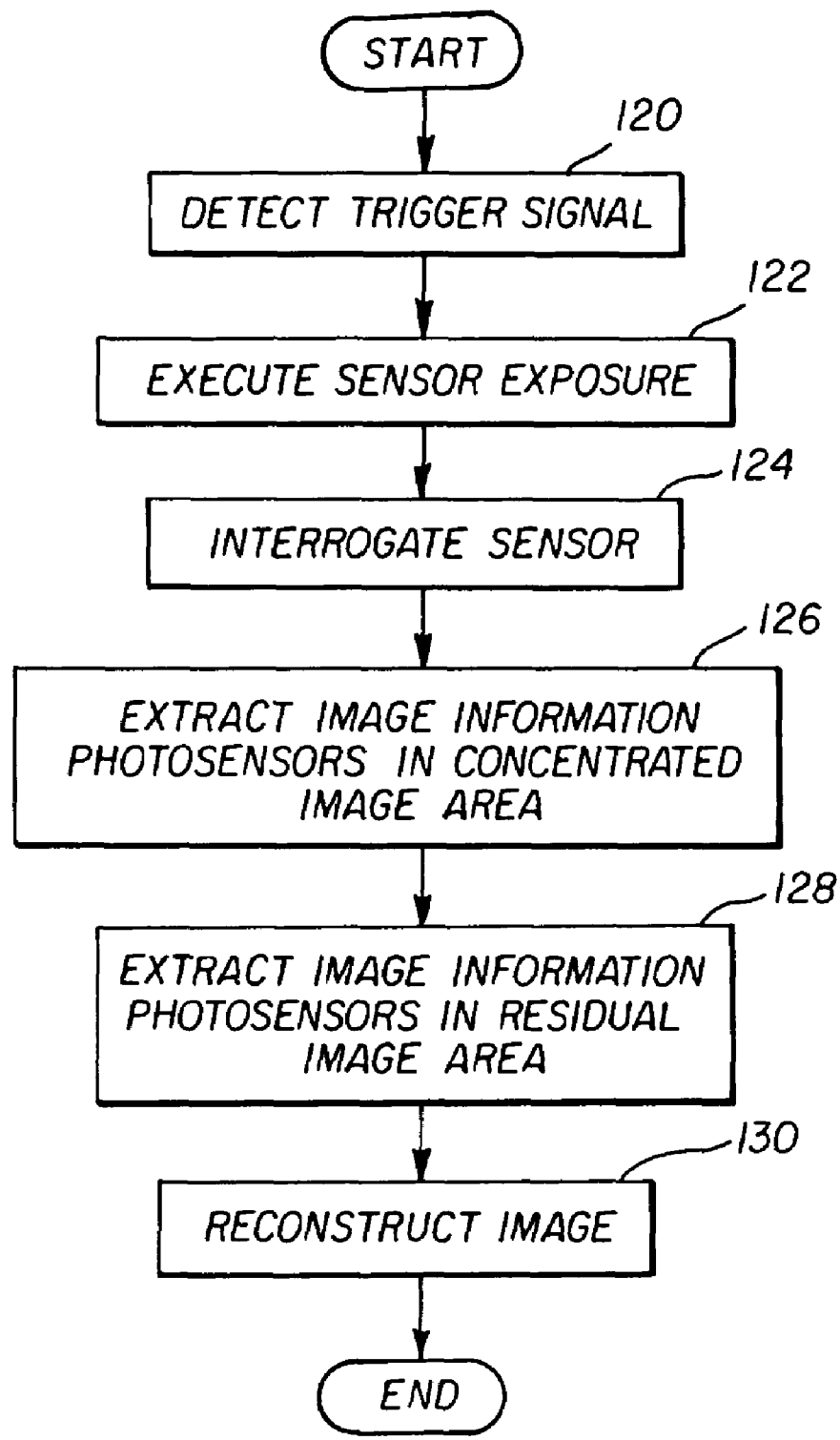
FIG. 11 shows a flow chart of imaging according to the invention.

FIG. 11 shows a flow chart of a method for capturing an image according to the invention. As is shown in FIG. 11, the process begins when a shutter trigger button 60 is depressed by user 4 causing a trigger signal to be generated (step 120). Microprocessor 50 detects the trigger signal indicating that shutter trigger button 60 has been depressed and captures an image as has been described above. Here a sensor exposure step is executed (step 122) using a imaging system 20 and image sensor 24 as described above. The micro-lens array 70 reduces range enhancing of scene information into concentrated image areas 74 and residual image areas 76. Sensor 124 is interrogated (step 124) to capture and fix the exposure information. In this embodiment, image information is extracted from photosensors 25b within the concentrated image areas 76. (step 126) Image information is also extracted from the photosensors 25a outside the concentrated image areas (step 128). The extracted image information is reconstructed (step 130) to form a likeness of the original scene.

Under low exposure conditions, scene information is determined based upon image conditions in the photosensors 25b in concentrated image areas 74. In one embodiment, photosensors 25b in concentrated image areas 74 are separated from photosensors 25a in residual image areas 76 during a calibration process so that image processor 40 can quickly and efficiently separate image information obtained from concentrated image areas 74 and residual image areas 76. Alternatively, a single image can be obtained from image sensor 24 and processed by digital signal processor 40 which then uses image analysis techniques to separate image information obtained from concentrated image areas 74 and image information obtained from residual image areas 76. Or image information is contained only in the areas captured by photosensors 25b. Here, digital signal processor 40 can render an image by assembling the image information obtained by photosensors 25b into an initial image which can be used to generate an archival or evaluation image as described above.

Figure 12:
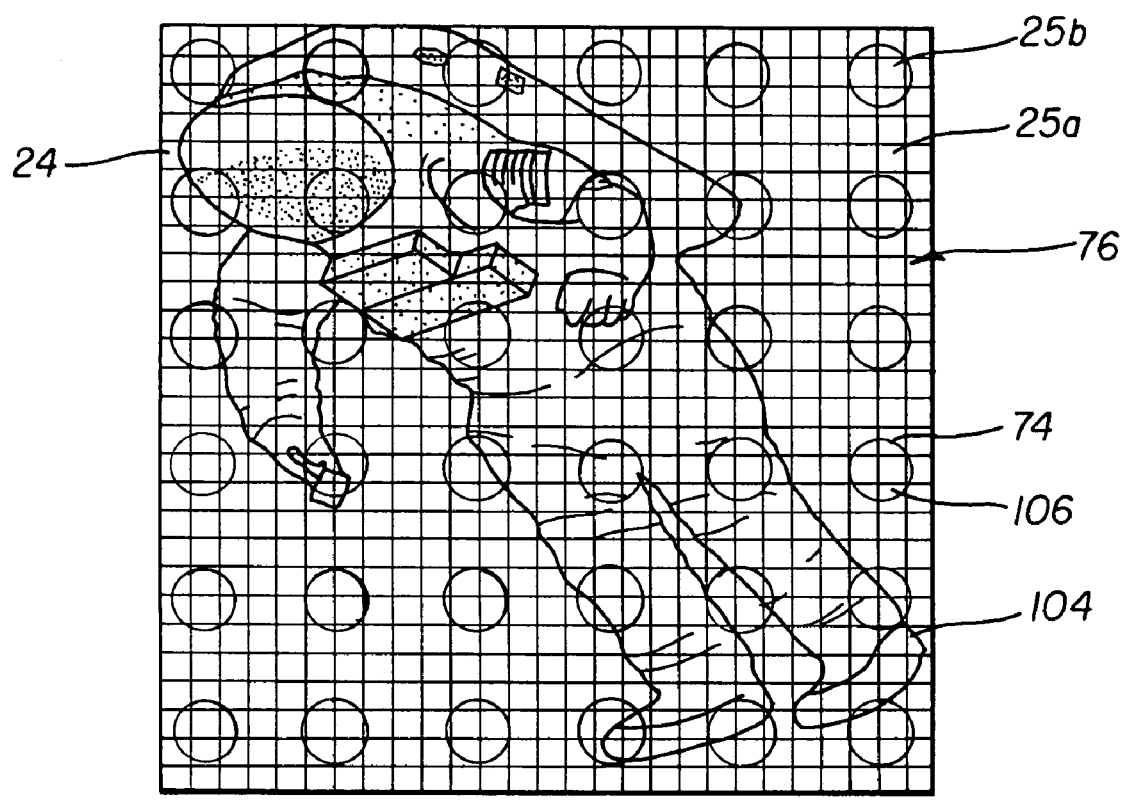
FIG. 12 shows a contrast pattern formed on an image sensor after imagewise exposure of image sensor.

Under high exposure conditions, scene information is carried in the photosensors 25a in residual image areas 76. FIG. 12 shows a contrast pattern image formed on image sensor 24 after image wise exposure of image sensor 24 to light from a scene that is within a second range of exposure 94. As is discussed above, when image system 20 is exposed to second exposure range 94 image information is directly recorded by photosensors 25a in residual image areas 76 in the form of a residual image 104. Residual image 104 is similar to the image formed by conventional optical imaging techniques. However, as is shown in FIG. 12, residual image 104 is not a continuous image in that imaging information useful in the composition of residual image 104 is lost during the concentration of light onto photosensors 25b. There are various methods by which this information can be corrected. For example, interpolation techniques can be used to compensate for the missing information. In certain applications, under sampling techniques can be used to process imaging information captured by photosensors 25a.

Alternatively, where exposure conditions in the scene overlap, scene information can be obtained from photosensors 25a and 25b. Further, it will be appreciated that exposure conditions can vary within an image and, therefore, that where a scene contains a wide range of exposure levels, it can occur that the exposure level in one portion of the image will be within the first exposure range 94 while the exposure level in the second portion of the same image will be in the second exposure range 96. Thus, in such an image, part of the image information will be obtained from photosensors 25b in the concentrated image areas 74 while another part of the image information will be obtained from photosensors 25a in residual image areas 76. Where this occurs, a single output image is composed by assembling the output image using image information for both concentrated image areas 48 and residual image areas 50. An image formed in this manner will contain imaging information representative of a scene exposure over a range that includes the entire desired latitude 88.

The invention has been described in detail with particular reference to certain preferred embodiments thereof, but it will be understood that variations and modifications can be effected within the spirit and scope of the invention.

PARTS LIST 2 eye
4 user
20 imaging system
22 taking lens unit
24 image sensor
25 photosensors
25a photosensors in a residual image area
25b photosensors in a concentrated image area
26 element
27 inactive areas
28 element30 lens driver
32 viewfinder system
33 viewfinder display
34 analog signal processor
35 viewfinder optics
36 A/D converter
38 frame memory
39 display driver
40 digital signal processor
42 exterior display
44 data memory
46 host computer interface
48 rangefinder 50 microprocessor
52 memory card
54 memory card slot
56 memory card interface
58 user controls
60 shutter trigger button
62 "wide" zoom lens button
63 accept button
64 "tele" zoom lens button
66 timing generator
68 sensor driver
69 additional image capture system
70 array of dynamic range enhancement micro-lenses
72 dynamic range enhancement micro-lens
72a first set of micro-lens
72b second set of micro-lens
74 concentrated image area
74a first set of concentrated image areas
74b second set of concentrated image areas
76 residual image area
78 support
80 scene luminance range
82 actual latitude of photosensor
84 lower response threshold
86 upper response threshold
88 desired system latitude
90 desired system lower response threshold
92 desired system upper response threshold
94 first range of scene exposure levels
96 second range of scene exposure levels
100 array of sensitivity enhancing micro-lenses
102 sensitivity enhancing micro-lenses
104 residual image
106 sensitivity enhancing concentrated light
108 fractured light
120 detect trigger signal step
122 execute sensor exposure step
124 interrogate sensor step
126 extract image information from photosensors in concentrated image area step
128 extract image information from photosensors in residual image area
130 reconstruct image step

What is claimed is:

1. An image sensor comprising:
an array of photosensors and an array of micro-lenses with each micro-lens confronting a group of more than one of the photosensors and concentrating light striking each micro-lens onto less than all of the confronted photosensors, so that said concentrating focuses the light striking the micro-lens so as to direct a portion of the light that would have traveled to photosensors in a residual image area onto selected photosensors located in a concentrated image area so that said selected photosensors receive enhanced exposure thereby increasing their effective sensitivity, and so that other photosensors in the group of photosensors associated with the micro-lens that are outside of the concentrated image area and that are located in the residual image area receive a reduced exposure thereby reducing the effective sensitivity of the other photosensors of the group; wherein said image sensor provides a output signals from which at least two images can be derived that are representative of a pattern of light incident on the array photosensors, said at least two images comprising at least a concentrated light image that can be derived from signals generated by the selected photosensors and a residual image that can be derived from signals generated by the other photosensors.

2. The image sensing system of claim 1, wherein each micro-lens confronts at least two photosensors.

3. The image sensor of claim 1, wherein the concentration of light by the micro-lenses enables an exposure increase of at least 0.15 log E at said selected photosensors relative to the exposure available to the same photosensors in the absence of said micro-lenses.

4. The image sensor of claim 1, wherein the concentration of light by the micro-lenses enables an exposure increase of less than 2.0 log E at the selected photosensors relative to the exposure available to the same photosensors in the absence of said micro-lenses.

5. The image sensor of claim 1, wherein the micro-lenses enable a latitude increase of at least 0.15 log E for said image sensor as compared to the latitude for the photosensors of the image sensor available in the absence of said micro-lenses, with the latitude of the micro-lens assisted image sensor being determined based upon a lower end latitude defined by a lower end of the latitude of the concentrated image and an upper end of the latitude of the residual image.

6. The image sensor of claim 1, wherein the micro-lenses enable a latitude increase of less than 3.0 log E for said image sensor as compared to the latitude for the photosensors of the image sensor available in the absence of said micro-lenses, with the latitude of the micro-lens assisted image sensor being determined based upon a lower end latitude defined by a lower end of the latitude of the concentrated image and an upper end of the latitude of the residual image.

7. The image sensor of claim 1, wherein the micro-lenses confront at least 50 percent of the photosensors.

8. A method for using an array of photosensors to capture an image of a scene comprising the steps of:
focusing light from the scene at the array of photosensors;
concentrating light focused at groups of more than one of the photosensors onto less than all of the photosensors of each group, so as to direct a portion of the light that would have traveled to photosensors in a residual image area onto selected photosensors located in concentrated image areas so that said selected photosensors receive enhanced exposure thereby increasing their effective sensitivity, and so that other photosensors in the group of photosensors associated with the micro-lens that are outside of concentrated image area and that are located in the residual image area receive a reduced exposure thereby reducing the effective sensitivity of the other photosensors of the group;
extracting image information from the photosensors of each group, said extracted image information including information extracted from selected photosensors from each group and from other photosensors from each group; and
forming an image using the extracted image information.

9. The method of claim 8, wherein image information extracted from the photosensors in each group receiving concentrated light is used to form the image.

10. The method of claim 8, wherein image information is extracted from the other photosensors is used to form the image.

11. The method of claim 8, wherein image information is extracted from the photosensors receiving concentrated light and the other photosensors is used to form an image.

12. An image sensing method for capturing an image using an image sensor that has photosensors, the method comprising the steps of:

focusing light from a scene onto a plurality of micro-lenses optically interposed between a primary lens enabling said focusing and a group of the photosensors, focusing the light striking the micro-lenses so as to direct a portion of the light that would have traveled to photosensors in a residual image area onto selected photosensors located in concentrated image areas so that said selected photosensors receive enhanced exposure thereby increasing their effective sensitivity, and so that other photosensors in the group of photosensors associated with the micro-lens that are outside of concentrated image area and that are located in the residual image area receive a reduced exposure thereby reducing the effective sensitivity of the other photosensors of the group;

extracting image information from photosensors within the concentrated image areas and from the photosensors outside the concentrated image areas; and reconstructing a likeness of the original scene from the extracted image infonnation, such that under low exposure conditions, scene information is determined based upon image conditions at the selected photosensors in concentrated image areas, and such that under high exposure conditions, scene information is determined based upon image conditions at the other photosensors in the residual image areas.

\* \* \* \* \*